United States Patent
Takaishi

(10) Patent No.: US 7,910,986 B2
(45) Date of Patent: Mar. 22, 2011

(54) SEMICONDUCTOR MEMORY DEVICE AND DATA PROCESSING SYSTEM

(75) Inventor: Yoshihiro Takaishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 266 days.

(21) Appl. No.: 12/130,542

(22) Filed: May 30, 2008

(65) Prior Publication Data

US 2008/0296671 A1  Dec. 4, 2008

(30) Foreign Application Priority Data

May 31, 2007 (JP) ................... 2007-144974

(51) Int. Cl.
H01L 29/78 (2006.01)

(52) U.S. Cl. ............... 257/329; 257/314; 257/E21.657; 257/E27.088; 257/300

(58) Field of Classification Search ................... 257/314, 257/E21.655, 300, 329, E21.657, E27.088
See application file for complete search history.

(56) References Cited

U.S. PATENT DOCUMENTS

| | | | |
|---|---|---|---|
| 5,460,994 A | 10/1995 | Kim | |
| 6,077,745 A * | 6/2000 | Burns et al. | 438/270 |
| 6,346,475 B1 | 2/2002 | Suzuki et al. | |
| 2003/0146469 A1 | 8/2003 | Matsuoka et al. | |
| 2004/0262635 A1 | 12/2004 | Lee | |
| 2007/0012996 A1 * | 1/2007 | Yoon et al. | 257/329 |
| 2007/0181925 A1 * | 8/2007 | Yoon et al. | 257/296 |
| 2007/0190766 A1 * | 8/2007 | Seo et al. | 438/585 |
| 2007/0246783 A1 * | 10/2007 | Moon et al. | 257/384 |
| 2007/0284623 A1 * | 12/2007 | Kim et al. | 257/213 |
| 2008/0124869 A1 * | 5/2008 | Yoon et al. | 438/268 |
| 2009/0189217 A1 * | 7/2009 | Yoon et al. | 257/329 |
| 2009/0197379 A1 * | 8/2009 | Leslie | 438/253 |

FOREIGN PATENT DOCUMENTS

| | | |
|---|---|---|
| JP | 5-136374 A | 6/1993 |
| JP | 6-209089 A | 7/1994 |
| JP | 07273221 A | 10/1995 |
| JP | 07321228 A | 12/1995 |
| JP | 9-8295 A | 1/1997 |
| JP | 2001110745 A | 4/2001 |
| JP | 2002-83945 A | 3/2002 |
| JP | 2003229537 A | 8/2003 |
| JP | 2003-303901 A | 10/2003 |
| JP | 2004-80004 A | 3/2004 |
| WO | 2005010934 A2 | 2/2005 |

* cited by examiner

*Primary Examiner* — Jerome Jackson, Jr.
*Assistant Examiner* — Paul A Budd
(74) *Attorney, Agent, or Firm* — Sughrue Mion, PLLC

(57) ABSTRACT

A semiconductor memory device includes a silicon pillar, a gate electrode covering a side surface of the silicon pillar via a gate insulation film, diffusion layers (11, 12) provided in a lower part and an upper part, respectively of the silicon pillar, a bit line connected to the diffusion layer (11), and a memory element connected to the diffusion layer (12). The bit line includes a silicon material region in contact with the diffusion layer (11), and a low-resistance region including a material having lower electric resistance than that of the silicon material region. As a result, the resistance of the bit line embedded in the substrate can be decreased.

14 Claims, 29 Drawing Sheets

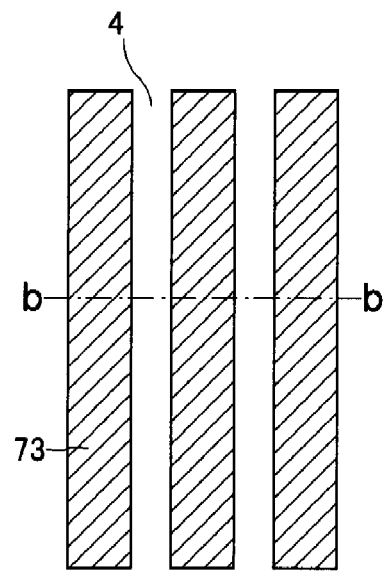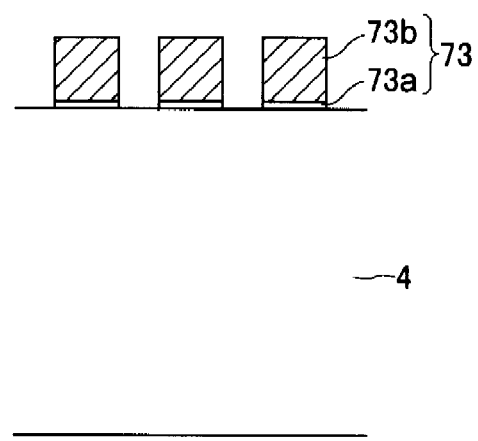
FIG.7A  FIG.7B
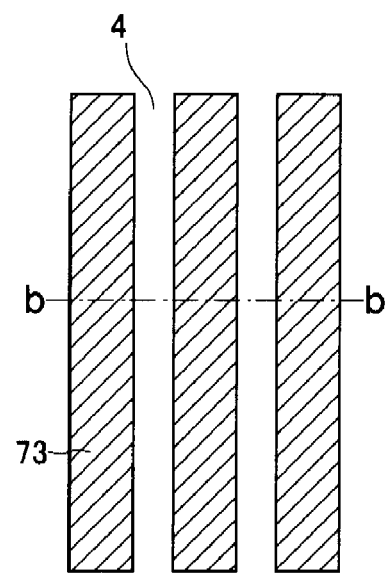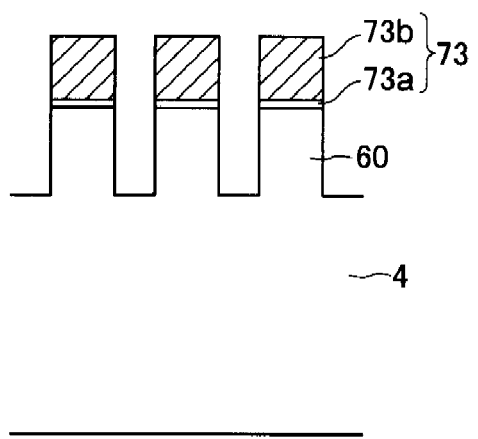
FIG.8A  FIG.8B

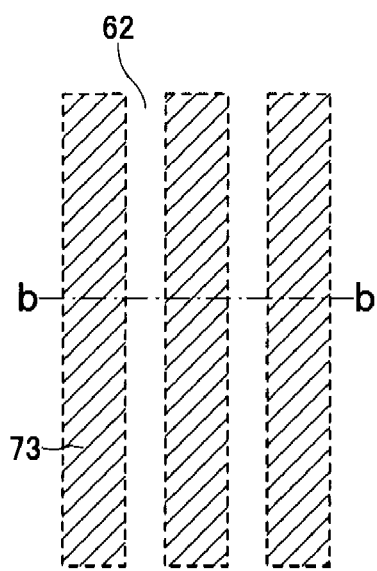
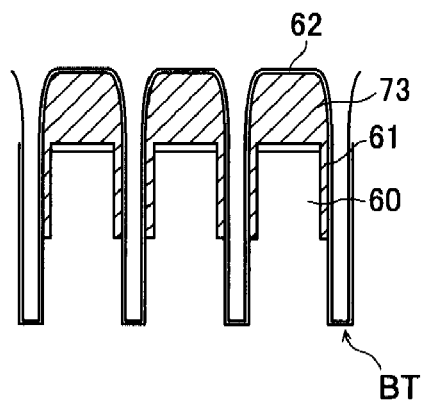
FIG.11A  FIG.11B
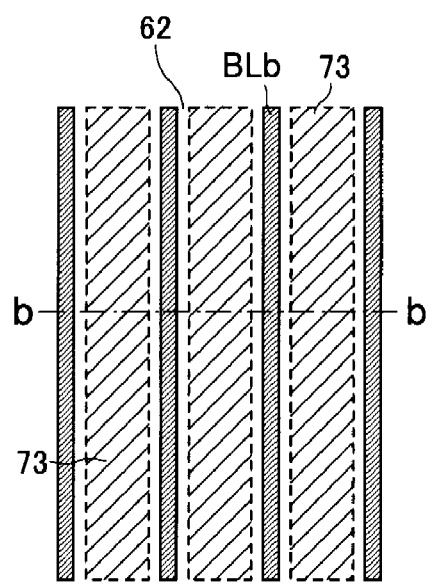
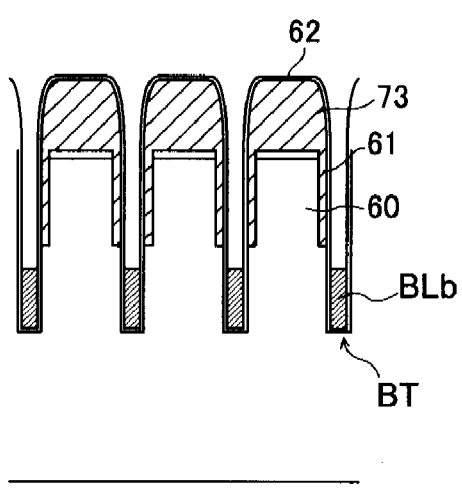
FIG.12A  FIG.12B

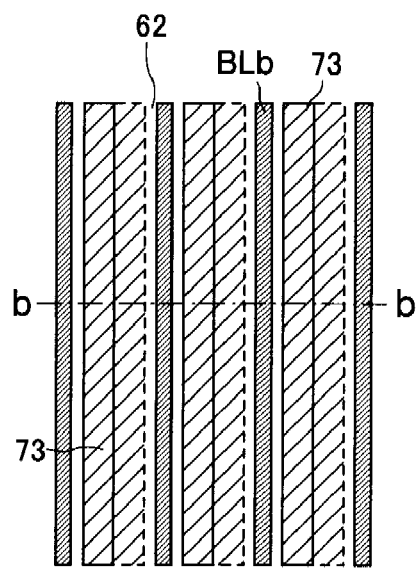
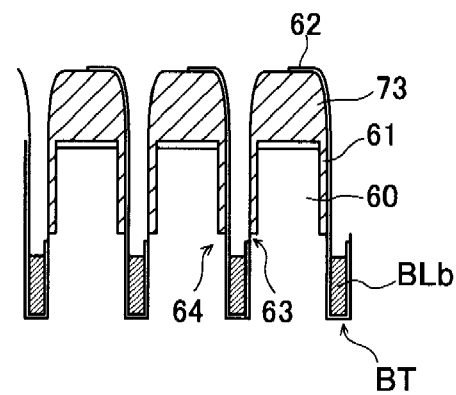
FIG.13A                FIG.13B
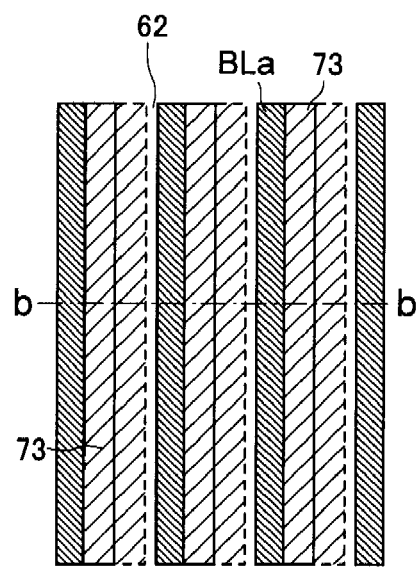
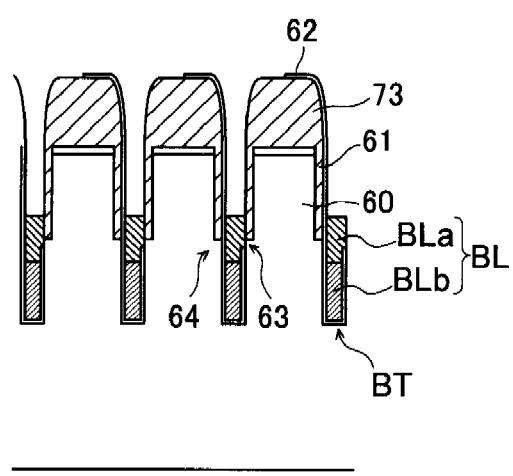
FIG.14A                FIG.14B

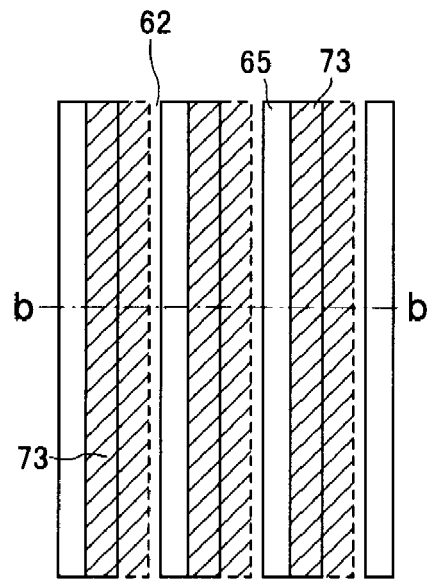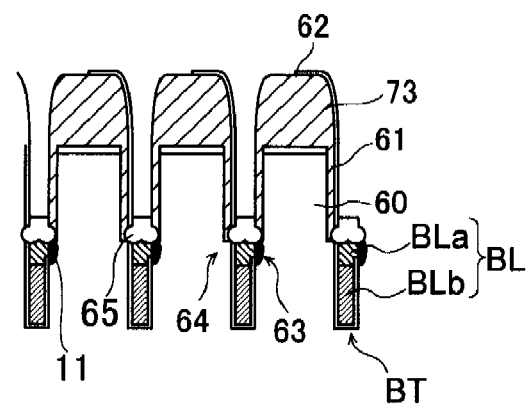
FIG.15A  FIG.15B
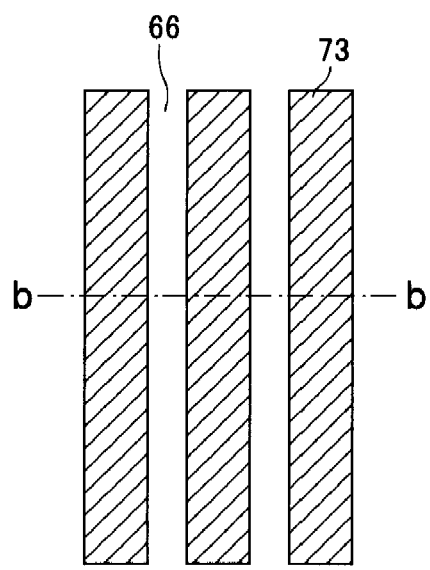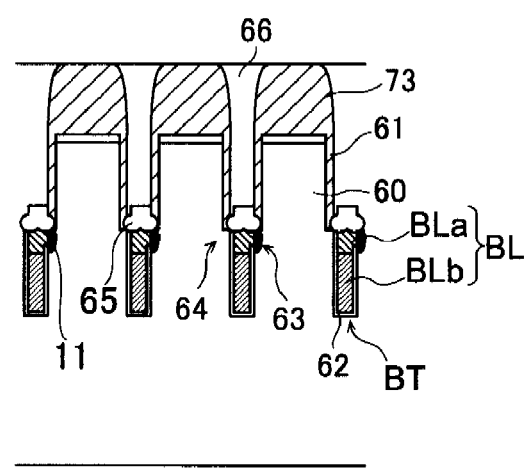
FIG.16A  FIG.16B

SEMICONDUCTOR MEMORY DEVICE AND DATA PROCESSING SYSTEM

TECHNICAL FIELD

The present invention relates to a semiconductor memory device and a method of manufacturing thereof, and more particularly relates to a semiconductor memory device having a vertical transistor using a silicon pillar, and a method of manufacturing thereof. Further, the present invention relates to a data processing system including foregoing semiconductor memory device.

BACKGROUND OF THE INVENTION

The integration of the semiconductor device has hitherto been achieved mainly by miniaturizing transistors. However, miniaturization of transistors has come to the limit, and when the transistors are attempted to be more miniaturized, there is a risk that the semiconductor device does not operate correctly due to the short-channel effect and the like.

As a method of basically solving this problem, there has been proposed a method of three-dimensionally processing a semiconductor substrate, thereby three-dimensionally forming a transistor. A three-dimensional transistor using a silicon pillar extending perpendicularly to the main surface of the semiconductor substrate as a channel has an advantage in that an occupied area is small and that a large drain current is obtained by a complete depletion. This three-dimensional transistor can be also used for a closest layout of $4F^2$ (see Japanese Patent Application Laid-open Nos. 2003-303901, H5-136374, H6-209089, H9-8295, 2002-83945 and 2004-80004).

In utilizing a vertical transistor using a silicon pillar as a cell transistor of a semiconductor memory device, it is common that one of diffusion layers becoming a source or drain is connected to a bit line and the other diffusion layer is connected to a memory element (a cell capacitor in a DRAM). Usually, a memory element like a cell capacitor is laid out above the cell transistor. Therefore, the memory element is connected to an upper part of the silicon pillar, and the bit line is connected to a lower part of the silicon pillar.

However, because there is the semiconductor substrate under the silicon pillar, to form a bit line under the silicon pillar, the bit line needs to be embedded into the substrate. While the embedded bit line can be formed by a diffusion layer, the wiring using the diffusion layer has a high resistance, and has a risk of preventing a high-speed operation.

SUMMARY OF THE INVENTION

It is, therefore, an object of the present invention to provide an improved semiconductor memory device having a vertical transistor using a silicon pillar, and a manufacturing method thereof.

Another object of the present invention is to provide a semiconductor memory device having a vertical transistor using a silicon pillar, the semiconductor memory device having a low-resistance bit line embedded in a substrate, and a manufacturing method of the semiconductor memory device.

Still another object of the present invention is to provide a data processing system including the semiconductor memory device.

The semiconductor device according to the present invention includes: a silicon pillar formed substantially perpendicular to a main surface of a substrate; a gate electrode covering a side surface of the silicon pillar via a gate insulation film; first and second diffusion layers provided in a lower part and an upper part, respectively of the silicon pillar; a bit line embedded into the substrate and connected to the first diffusion layer; and a memory element disposed above the silicon pillar and connected to the second diffusion layer, the bit line includes a silicon material region in contact with the first diffusion layer and a low-resistance region including a material having lower electric resistance than that of the silicon material region.

The "above the silicon pillar" means the opposite side of the substrate from the viewpoint of the silicon pillar. Similarly, "a lower part and an upper part of the silicon pillar" means a region at the substrate side and a region at the opposite side of the substrate, respectively from the viewpoint of the silicon pillar. Furthermore, "a lower part and an upper part of the silicon pillar" do not need to be right above and right below the silicon pillar, respectively. Further, "a lower part and an upper part of the silicon pillar" can be configured by apart of the silicon pillar, respectively, or can be configured by parts separate from the silicon pillar.

In the present invention, preferably, the memory element is a capacitor. According to this, a DRAM using the silicon pillar as a cell transistor can be configured. Also preferably, the memory element is a phase-change element. According to this, a PRAM using the silicon pillar as a cell transistor can be configured. In addition, the data processing system of the present invention includes the semiconductor memory device described above.

The method of manufacturing a semiconductor device according to the present invention includes: a first step of forming a plurality of silicon fins extending to a predetermined direction, by etching the substrate; a second step of forming bit trenches located between the adjacent silicon pins by etching the substrate; a third step of embedding a low-resistance regions of the bit line into a bottom of the bit trenches, after covering the inner surface of the bit trenches by an insulation film; a fourth step of exposing a part of a sidewall of the bit trenches by partially removing the insulation film formed on the upper part of the bit trenches; and a fifth step of embedding a silicon material region of the bit line into an upper part of the bit trench so as to be in contact with the exposed sidewall.

As explained above, according to the semiconductor memory device of the present invention, because the bit line embedded in the substrate includes the silicon material region and the low-resistance region, the bit line resistance can be decreased. Further, according to the method of manufacturing a semiconductor memory device of the present invention, the insulation film covers the low-resistance region excluding a surface which is in contact with the silicon material region. Therefore, the substrate can be prevented from being polluted by the material constituting the low-resistance region.

BRIEF DESCRIPTION OF THE DRAWINGS

The above and other objects, features and advantages of this invention will become more apparent by reference to the following detailed description of the invention taken in conjunction with the accompanying drawings, wherein:

FIGS. 7A and 7B show a process (forming a hard mask 73) in a method of manufacturing the semiconductor memory device according to the present embodiment;

FIGS. 8A and 8B show a process (forming a silicon fin 60) in the method of manufacturing the semiconductor memory device according to the present embodiment;

FIGS. 11A and 11B show a process (forming a silicon oxide film 62) in the method of manufacturing the semiconductor memory device according to the present embodiment;

FIGS. 12A and 12B show a process (forming a low-resistance region BLb of a bit line BL) in the method of manufacturing the semiconductor memory device according to the present embodiment;

FIGS. 13A and 13B show a process (selectively removing the silicon oxide film 62) in the method of manufacturing the semiconductor memory device according to the present embodiment;

FIGS. 14A and 14B show a process (forming a silicon material region BLa of the bit line BL) in the method of manufacturing the semiconductor memory device according to the present embodiment;

FIGS. 15A and 15B show a process (forming a first diffusion layer 11) in the method of manufacturing the semiconductor memory device according to the present embodiment;

FIGS. 16A and 16B show a process (forming a silicon oxide film 66) in the method of manufacturing the semiconductor memory device according to the present embodiment;

DETAILED DESCRIPTION OF THE EMBODIMENTS

Preferred embodiments of the present invention will now be explained below in detail with reference to the accompanying drawings.

Figure 1:
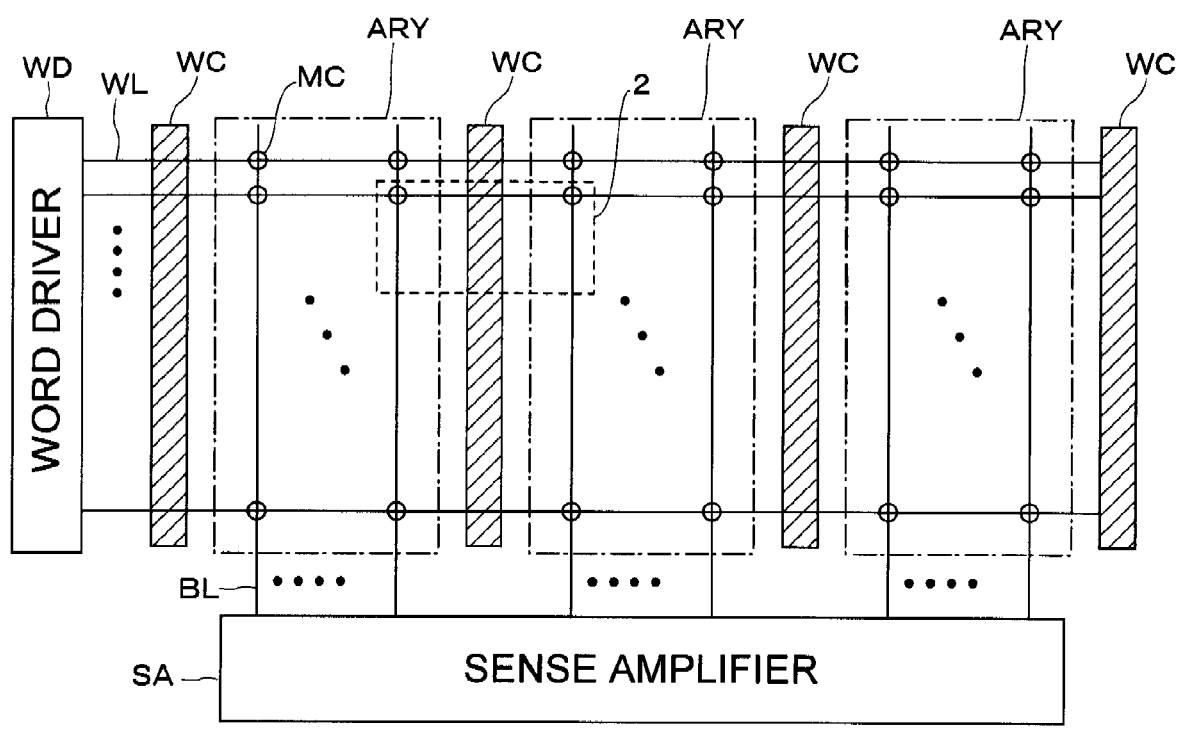
FIG. 1 is a schematic diagram of a basic configuration of a semiconductor memory device according to a preferred embodiment of the present invention.

FIG. 1 is a schematic diagram of a basic configuration of a semiconductor memory device according to a preferred embodiment of the present invention.

As shown in FIG. 1, the semiconductor memory device according to the present invention includes plural word lines WLs driven by a word driver WD, plural bit lines BLs connected to a sense amplifier SA, and memory cells MCs laid out at intersections between the word lines WLs and the bit lines BLs. A cell array region ARY having the memory cells MCs laid out in a matrix shape are split into several regions in the extension direction of the word lines WLs. A word-line connection region WC is provided at the end of each cell array region ARY. As described later, the word line WL includes a gate electrode and an auxiliary word line, and the gate electrode and the auxiliary word line are short-circuited in the word-line connection region WC.

Figure 2:
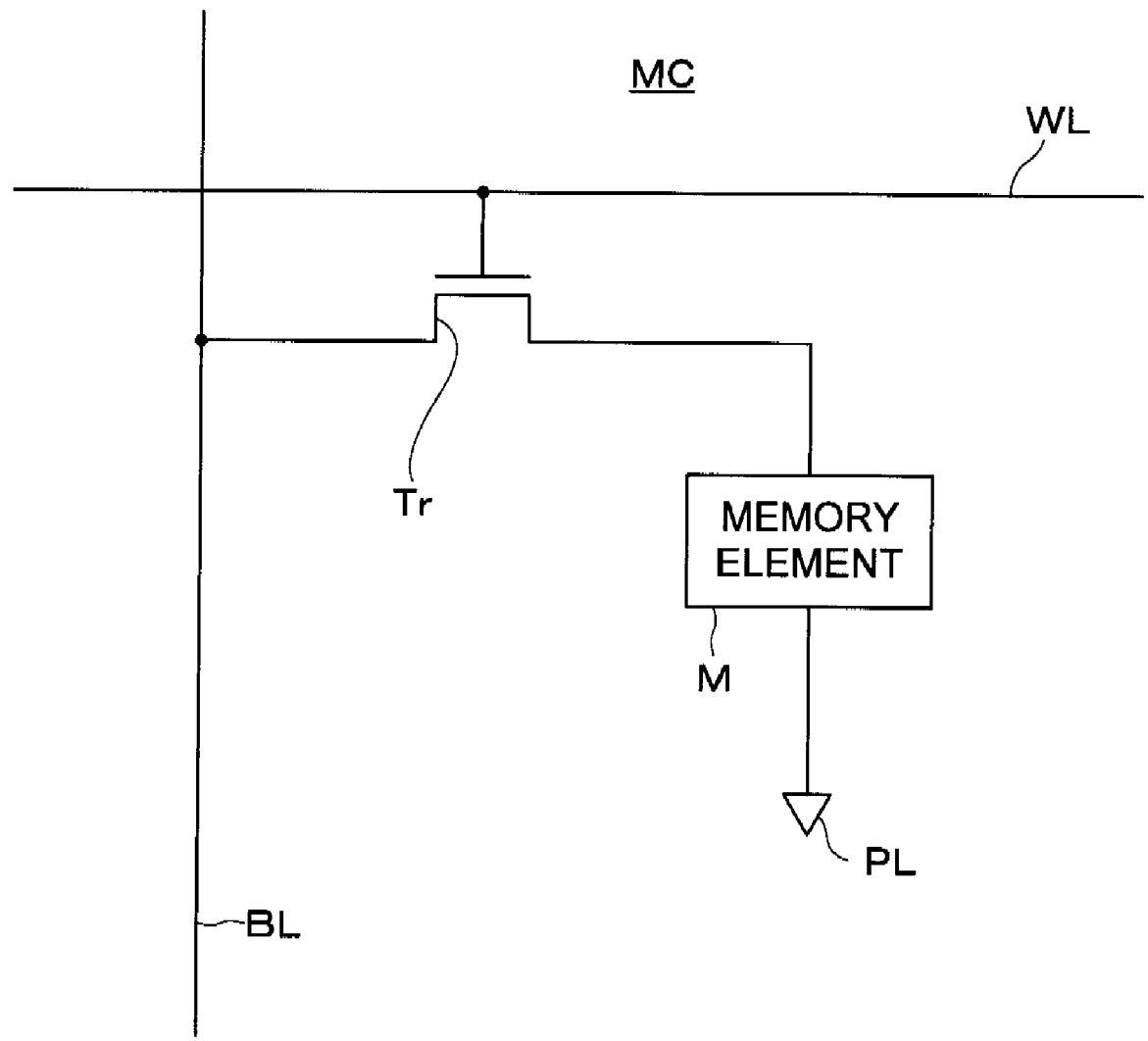
FIG. 2 is a circuit diagram of the memory cell MC.

FIG. 2 is a circuit diagram of the memory cell MC.

As shown in FIG. 2, the memory cell MC has such a configuration that a cell transistor Tr and a memory element M are connected in series in this order, between the bit line BL and a reference potential wiring PL. A gate electrode of the cell transistor Tr is connected to the corresponding word line WL. While a type of the memory element M is not particularly limited, a capacitor is used for the DRAM, and a phase-change element is used for the PRAM.

A device configuration of the semiconductor memory device according to the present embodiment is explained below, taking an example that the memory element M is a capacitor.

Figure 3:
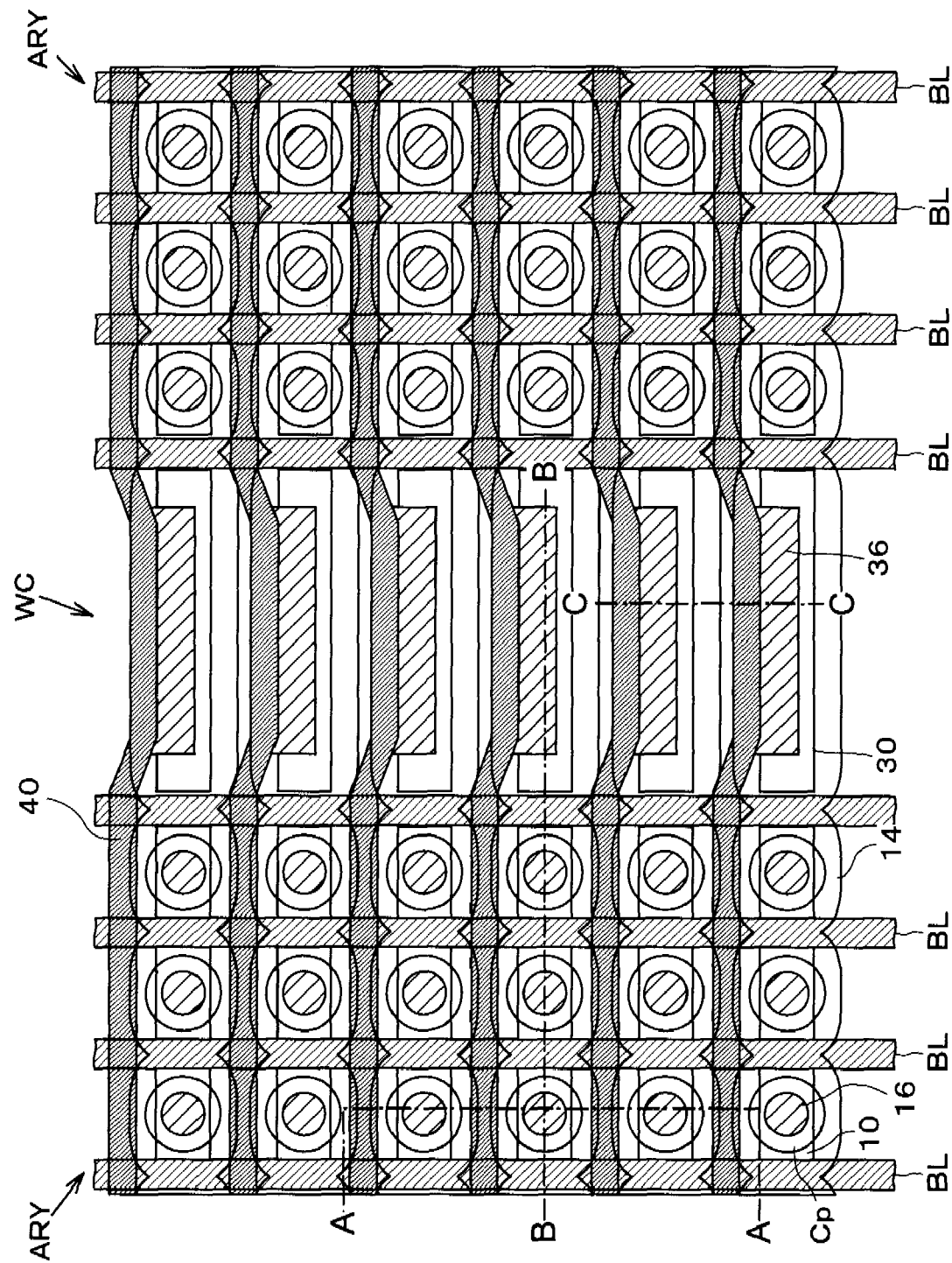
FIG. 3 is a schematic top plan view of a configuration of a region 2 shown in FIG. 1.
Figure 4:
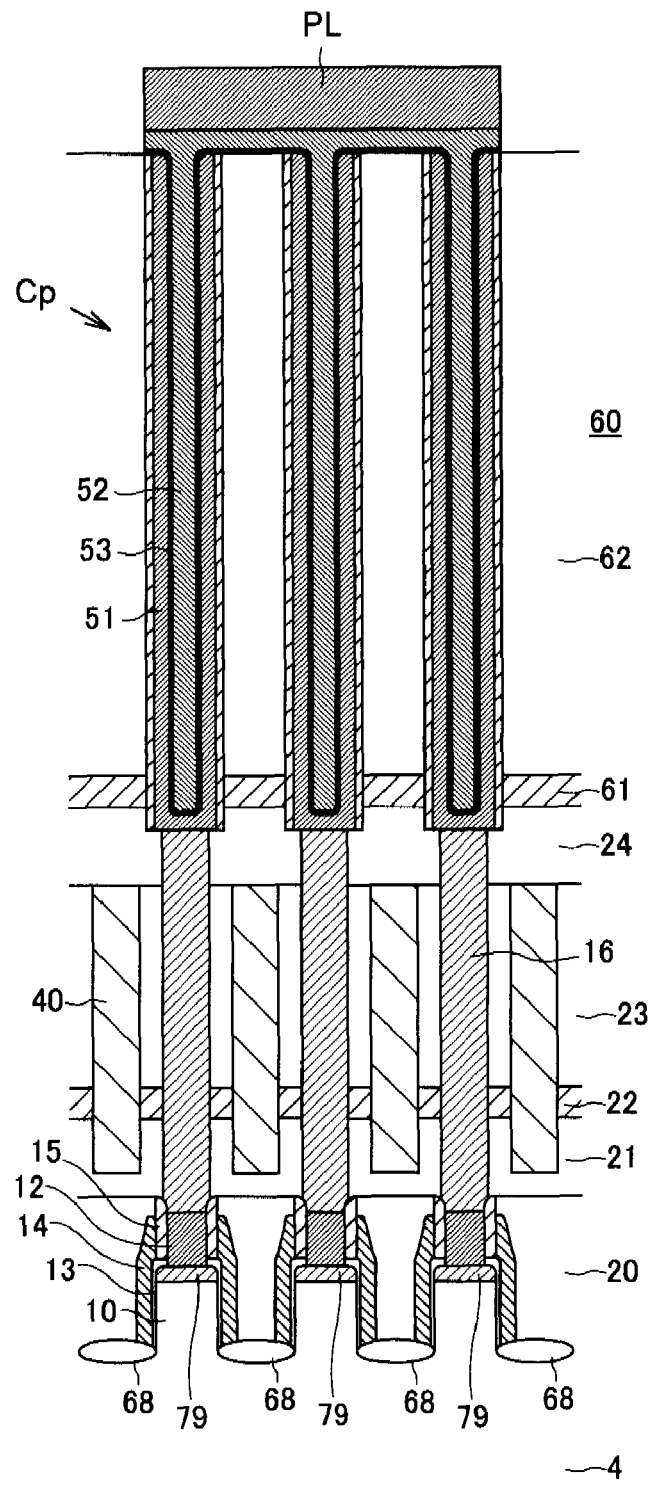
FIG. 4 is a schematic cross-sectional view along a line A-A in FIG. 3.
Figure 5:
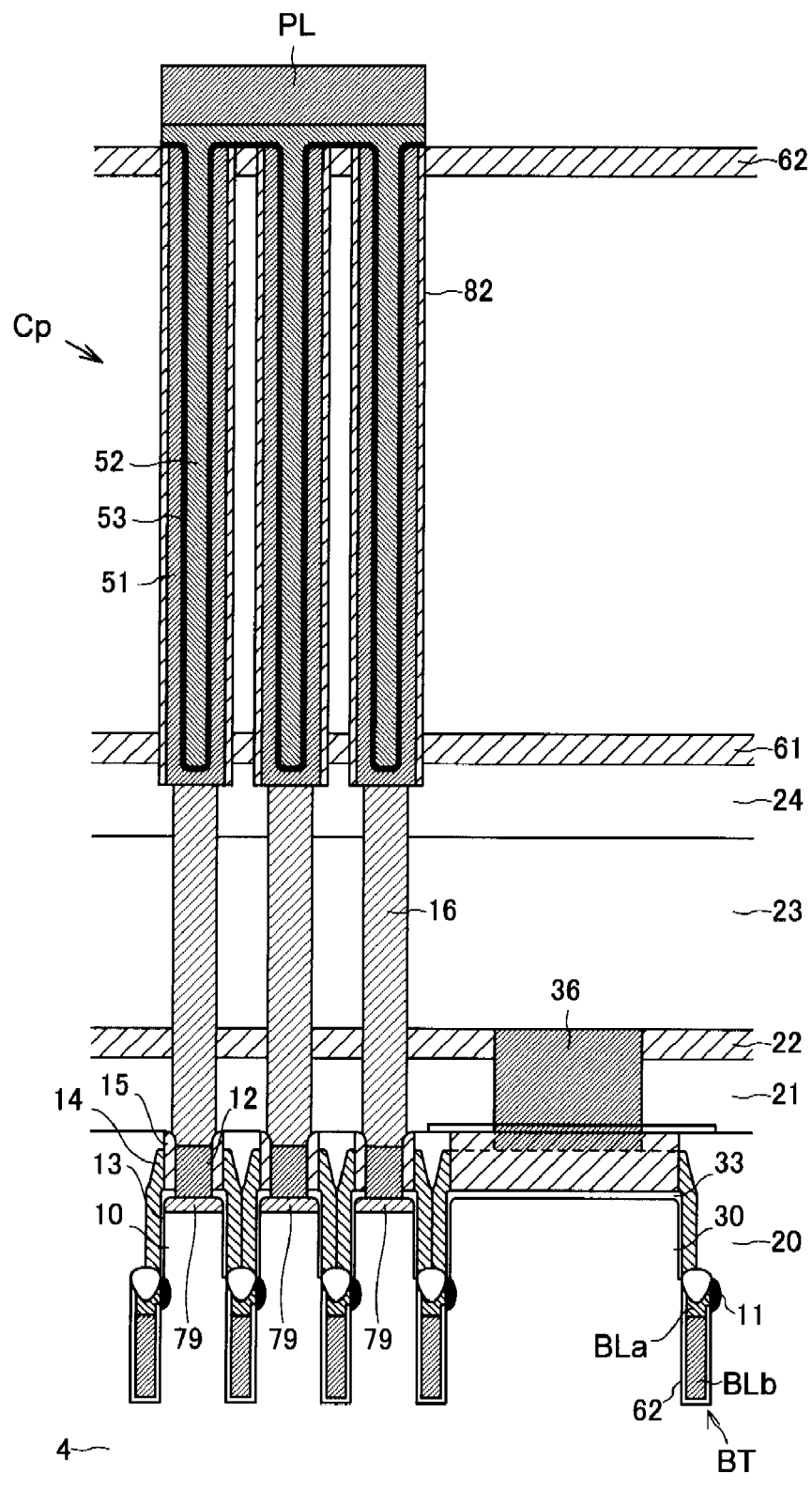
FIG. 5 is a schematic cross-sectional view along a line B-B in FIG. 3.
Figure 6:
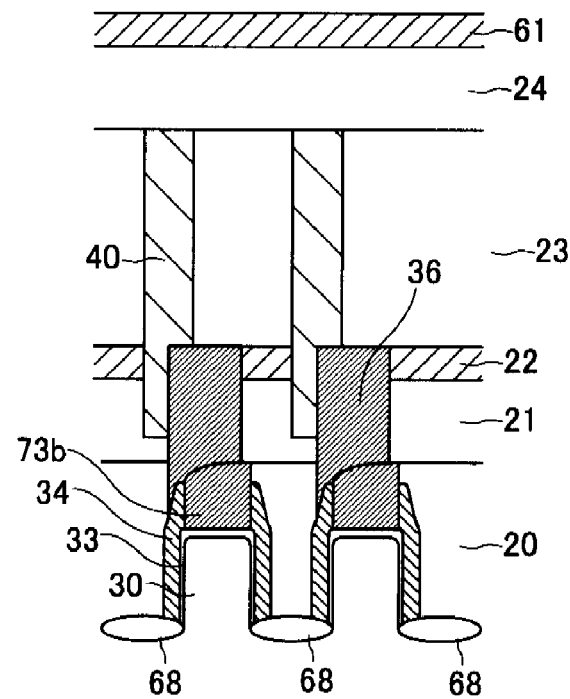
FIG. 6 is a schematic cross-sectional view along a line C-C in FIG. 3.

FIG. 3 is a schematic top plan view of a configuration of a region 2 shown in FIG. 1. FIG. 4 is a schematic cross-sectional view along a line A-A in FIG. 3. FIG. 5 is a schematic cross-sectional view along a line B-B in FIG. 3. FIG. 6 is a schematic cross-sectional view along a line C-C in FIG. 3. To facilitate the interpretation of the configuration shown in FIG. 3 as a schematic top plan view, a part of constituent elements is omitted.

As shown in FIG. 3 to FIG. 5, plural silicon pillars 10 formed substantially perpendicularly to a main surface of the substrate are provided in a matrix shape in the cell array region ARY. A first diffusion layer 11 functioning as one of a source and a drain is formed at a lower part of the silicon pillar 10, and a second diffusion layer 12 functioning as the other of the source and the drain is formed at an upper part of the silicon pillar 10. A gate electrode 14 is formed on a side surface of the silicon pillar 10 via a gate insulation film 13. These elements constitute the cell transistor Tr shown in FIG. 2.

The silicon pillar 10 is a part becoming a channel region of the cell transistor Tr. The first diffusion layer 11 is connected to the bit line BL shown in FIG. 2, and the second diffusion layer 12 is connected to the memory element M (capacitor, in the present example) shown in FIG. 2. The bit line BL connected to the first diffusion layer 11 is embedded into a bit trench BT formed in a silicon substrate 4.

The bit line BL includes a silicon material region BLa in contact with the first diffusion layer 11, and a low-resistance region BLb provided at a lower part of the silicon material region BLa. The silicon material region BLa includes polysilicon doped with an impurity. The low-resistance region BLb includes a material having lower electric resistance than that of the silicon material region BLa. Preferably, a metal or a metal compound including silicide is selected for this material for the low-resistance region BLb. A low-resistance material such as a metal and silicide becomes a cause of polluting the silicon substrate 4. However, because the surface of the low-resistance region BLb is covered by an insulation film 62 excluding the surface in contact with the silicon material region BLa, the substrate is not polluted.

An opening is formed in the insulation film covering the upper part of the silicon pillar 10. The second diffusion layer 12 is connected to the upper part of the silicon pillar 10 via this opening. A cylindrical sidewall insulation film 15 is provided around the second diffusion layer 12, thereby insulating the second diffusion layer 12 and the gate electrode 14. The external periphery of the cylindrical sidewall insulation film 15 and the external periphery of the silicon pillar 10 coincide in plane view. This is attributable to a method of manufacturing the cell transistor Tr described later.

The second diffusion layer 12 is connected to a lower electrode 51 of a capacitor Cp becoming the memory element M, via a storage node contact 16 penetrating through interlayer insulation films 21 to 24. An upper electrode 52 of the capacitor Cp is connected to the reference potential wiring PL shown in FIG. 2.

As shown in FIG. 3, an interval between the adjacent silicon pillars 10 is set relatively small in the word line direction, and is set relatively large in the bit line direction. Specifically, an interval between the silicon pillars 10 adjacent in the word line direction is set smaller than two times the film thickness of the gate electrode 14. On the other hand, an interval between the silicon pillars 10 adjacent in the bit line direction is set larger than two times the film thickness of the gate electrode 14. Accordingly, the gate electrodes 14 covering the silicon pillars 10 adjacent in the word line direction are in contact with each other. On the other hand, the gate electrodes 14 covering the silicon pillars 10 in the bit line direction are isolated from each other.

A dummy silicon pillar 30 is present in a row of the silicon pillars 10 extending to the word line direction. A region in which plural dummy silicon pillars 30 are provided in the bit line direction is the word-line connection region WC.

As shown in FIG. 5 and FIG. 6, a dummy gate electrode 34 is formed on the side surface of the dummy silicon pillar 30 via a dummy-gate insulation film 33. An interval between the silicon pillar 10 and the dummy silicon pillar 30 in the word line direction coincides with an interval between the silicon pillars 10 adjacent in the word line direction. Therefore, the gate electrode 14 covering the silicon pillar 10 is in contact with the dummy gate electrode 34 covering the dummy silicon pillar 30 in the word line direction. The dummy gate electrode 34 is connected to an auxiliary word line 40 via a word contact 36.

The auxiliary word line 40 is a wiring extending to the word line direction, and connects the gate electrode 14 to an upper layer wiring. That is, according to the vertical transistor using the silicon pillar 10, the gate electrode 14 is positioned on the side surface of the silicon pillar 10. Therefore, the gate electrode 14 cannot be easily connected to the upper layer wiring. However, when the dummy gate electrode 34 covering the dummy silicon pillar 30, and the auxiliary word line 40 connected to the dummy gate electrode 34 are used, the gate electrode 14 can be easily connected to the upper layer wiring. Further, because the word signal is bypassed by the auxiliary word line 40, operation delay of the cell transistor far from the word driver WD can be also suppressed. Therefore, preferably, the auxiliary word line 40 includes a material having smaller electric resistance than that of the gate electrode 14.

In the present embodiment, while the auxiliary word line 40 is bent to the word contact 36 side in the word-line connection region WC, the auxiliary word line 40 can have a linear shape. However, in the case where the auxiliary word line 40 is bent to the word contact 36 side in the word-line connection region WC, a contact area between the word contact 36 and the auxiliary word line 40 can be increased.

Furthermore, as shown in FIG. 4 and FIG. 5, the capacitor Cp includes a cylinder lower electrode 51 connected to the storage node contact 16, a cylindrical upper electrode 52 connected to the reference potential wiring PL, and a capacitive insulation film 53 provided between the lower electrode 51 and the upper electrode 52.

The above explains the configuration of the semiconductor memory device according to the present embodiment. According to the semiconductor memory device of the present embodiment, the bit line BL embedded in the silicon substrate 4 includes the low-resistance region BLb as described above. Therefore, resistance can be decreased more than that of the conventional embedded bit line. The method of manufacturing the semiconductor memory device according to the present embodiment is explained below.

FIG. 7 to FIG. 41 are process diagrams for explaining the method of manufacturing the semiconductor memory device according to the present embodiment. In FIGS. 7 to 23, the diagram A represents a schematic top plan view, B represents a schematic cross-sectional view along a line b-b, C represents a schematic cross-sectional view along a line c-c, D represents a schematic cross-sectional view along a line d-d, and E represent a schematic cross-sectional view along a line e-e.

First, as shown in FIGS. 7A and 7B, a silicon oxide film 73a and a silicon nitride film 73b are sequentially formed on the silicon substrate 4, and these films are patterned, thereby forming plural hard masks 73 extending to the bit line direction. Next, as shown in FIGS. 8A and 8B, the silicon substrate 4 is etched using the hard masks 73, thereby forming plural silicon fins 60 extending to the bit line direction. The height of the silicon fin 60 coincides with the height of the silicon pillar 10 finally formed.

Figure 9A:
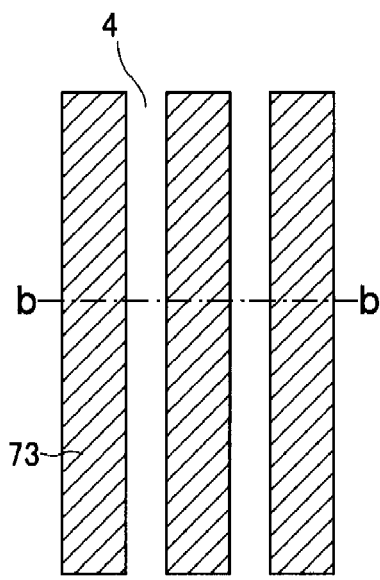
FIGS. 9A and 9B show a process (forming a sidewall nitride film 61) in the method of manufacturing the semiconductor memory device according to the present embodiment.
Figure 9B:
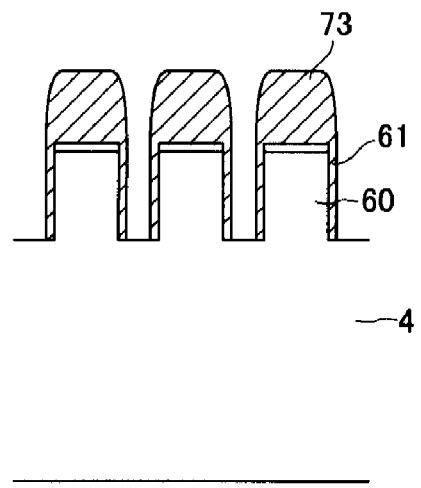
Figure 10A:
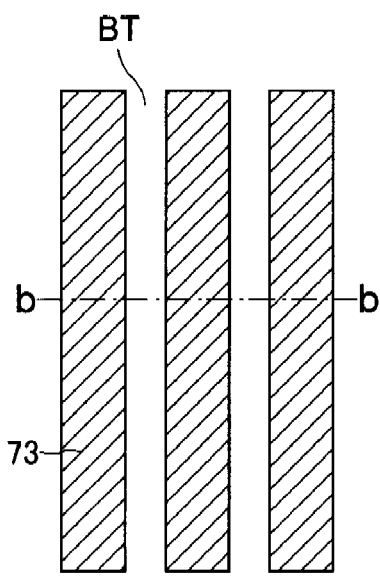
FIGS. 10A and 10B show a process (forming a bit trench BT) in the method of manufacturing the semiconductor memory device according to the present embodiment.
Figure 10B:
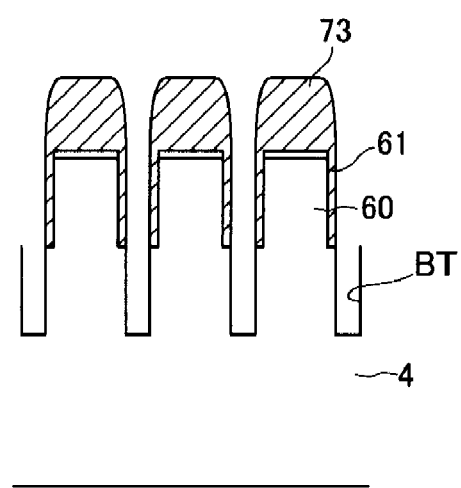
Figure 17A:
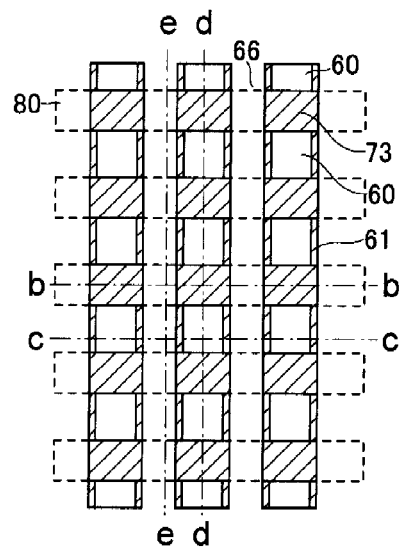
FIGS. 17A to 17E show a process (patterning the hard mask 73) in the method of manufacturing the semiconductor memory device according to the present embodiment.
Figures 17B, 17C:
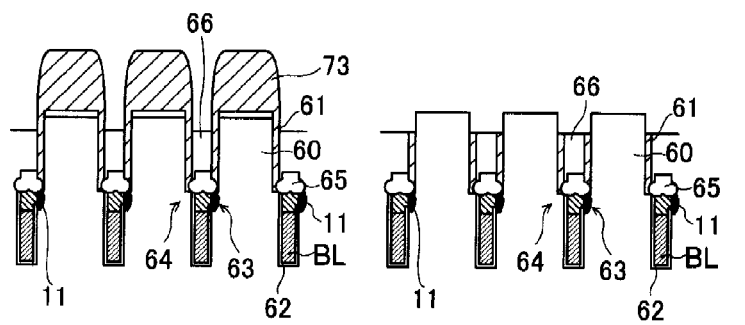
Figure 17D:
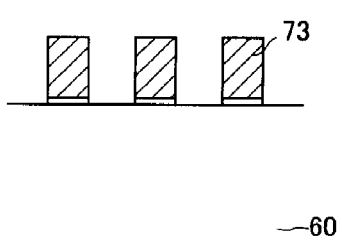
Figure 17E:
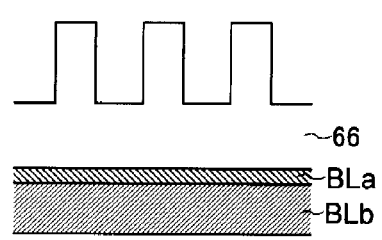
Figure 18A:
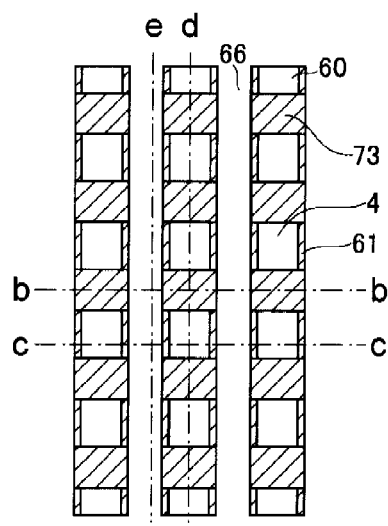
FIGS. 18A to 18E show a process (forming a silicon pillar 10) in the method of manufacturing the semiconductor memory device according to the present embodiment.
Figure 18B:
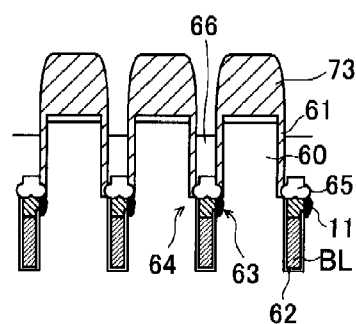
Figure 18C:
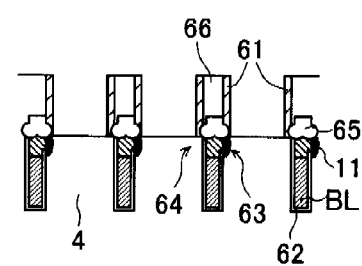
Figure 18D:
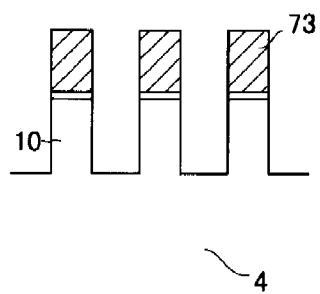
Figure 18E:
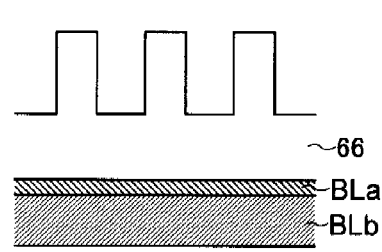
Figure 19A:
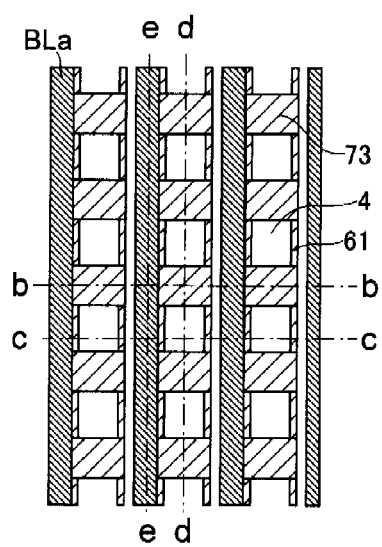
FIGS. 19A to 19E show a process (removing the silicon oxide films 65 and 66) in the method of manufacturing the semiconductor memory device according to the present embodiment.
Figure 19B:
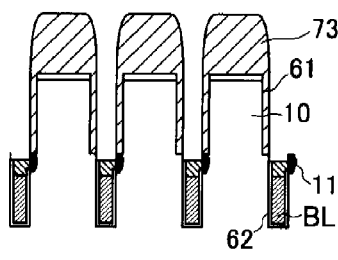
Figure 19C:
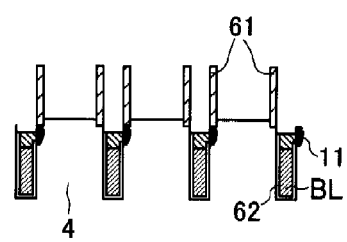
Figure 19D:
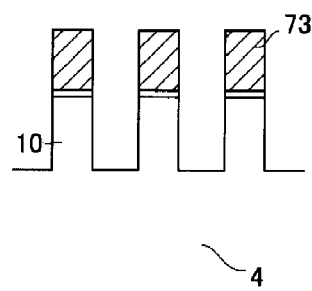
Figure 19E:
Figure 20A:
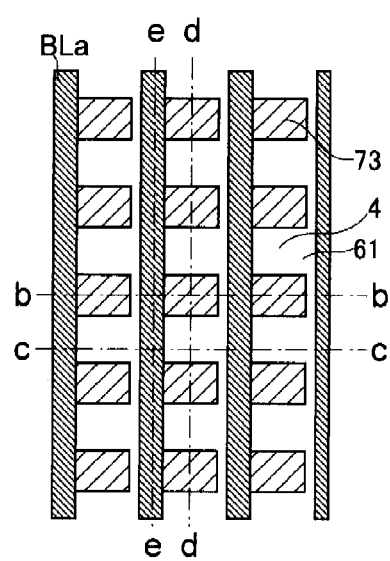
FIGS. 20A to 20E show a process (removing the sidewall nitride film 61) in the method of manufacturing the semiconductor memory device according to the present embodiment.
Figure 20B:
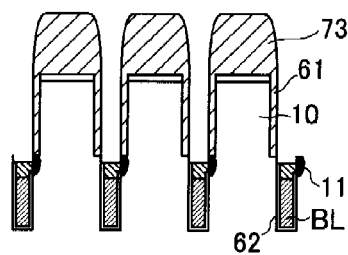
Figure 20C:
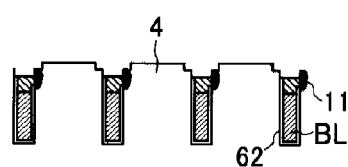
Figure 20D:
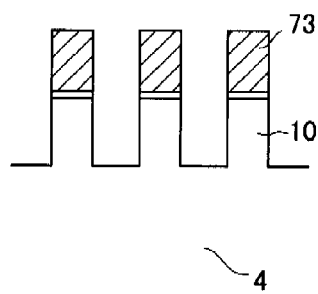
Figure 20E:
Figure 21A:
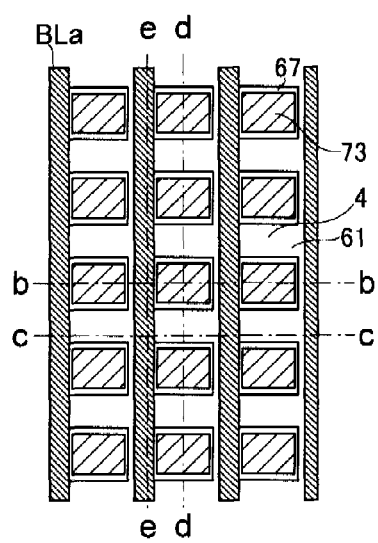
FIGS. 21A to 21E show a process (forming a sidewall nitride film 67) in the method of manufacturing the semiconductor memory device according to the present embodiment.
Figures 21B, 21C:
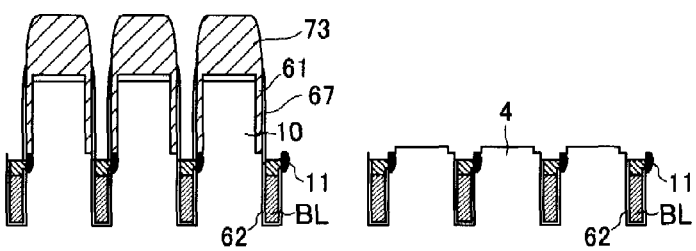
Figure 21D:
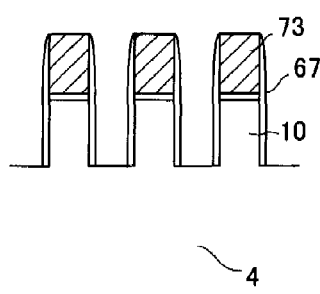
Figure 21E:
Figure 22A:
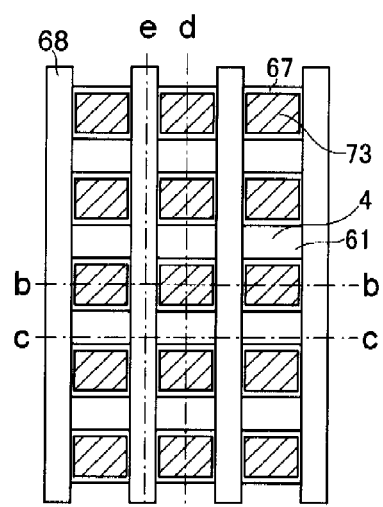
FIGS. 22A to 22E show a process (forming a silicon oxidation film 68) in the method of manufacturing the semiconductor memory device according to the present embodiment.
Figures 22B, 22C:
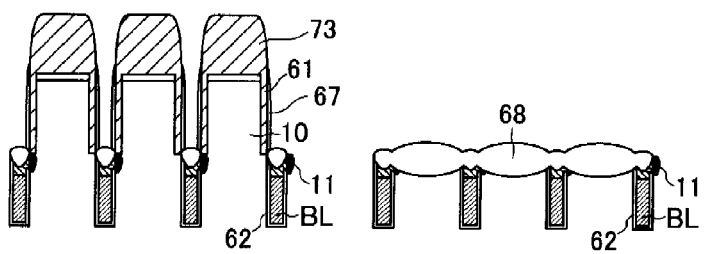
Figure 22D:
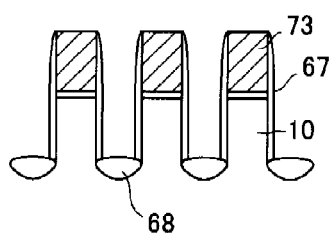
Figure 22E:
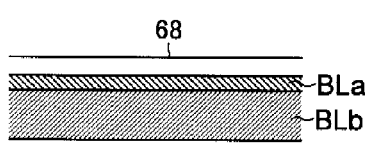
Figure 23A:
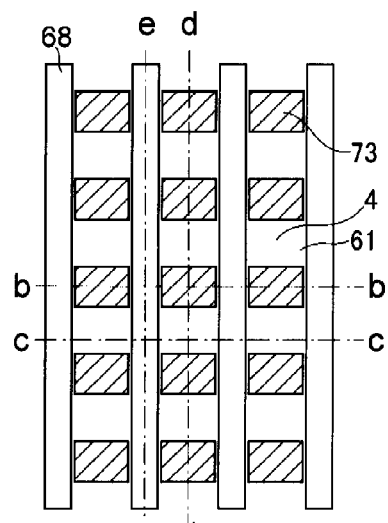
FIGS. 23A to 23E show a process (removing the sidewall nitride films 61 and 67) in the method of manufacturing the semiconductor memory device according to the present embodiment.
Figure 23B:
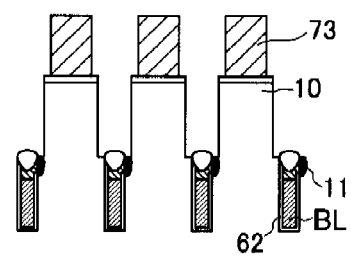
Figure 23C:
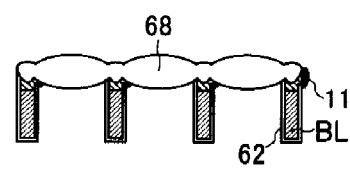
Figure 23D:
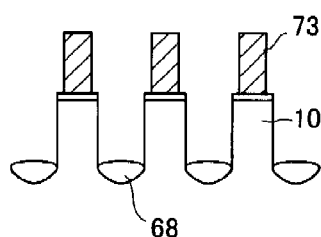
Figure 23E:
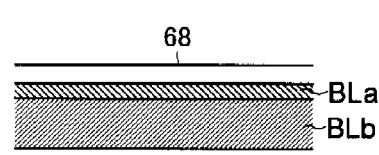

Next, as shown in FIGS. 9A and 9B, a silicon nitride film is formed on the whole surface, and this film is etched back. As a result, a sidewall of the silicon fin 60 is covered by a sidewall nitride film 61. On the other hand, the silicon substrate 4 is exposed at the bottom between adjacent silicon fins 60. In this state, the silicon substrate 4 is etched using the hard mask 73 and the sidewall nitride films 61 as a mask, thereby forming a bit trench BT between the adjacent silicon fins 60, as shown in FIGS. 10A and 10B. The bit trench BT extends to the bit line direction like the silicon fin 60.

Next, as shown in FIGS. 11A and 11B, a silicon oxide film 62 is formed on the whole surface by the CVD method. Accordingly, the whole surface of the silicon substrate 4 exposed on the surface of the bit trench BT is covered by the silicon oxide film. In this state, as shown in FIGS. 12A and 12B, a conductive film becoming a material of the low-resistance region BLb is deposited on the whole surface, and the conductive film is etched back. Preferably, a metal or a metal compound including silicide is selected as a material of the low-resistance region BLb, as described above. An etch-back amount needs to be adjusted so that the upper surface of the low-resistance region BLb is positioned lower than the lower surface of the sidewall nitride film 61. However, when the etch-back amount is too large, a remaining film thickness of the low-resistance region BLb becomes small, and therefore, advantage of low resistance decreases. Accordingly, preferably, the etch-back amount is adjusted so that the upper surface of the low-resistance region BLb is positioned slightly lower than the lower surface of the sidewall nitride film 61.

As a result, the low-resistance region BLb of the bit line BL is embedded into the bottom of the bit trench BT. In this case, because the whole surface of the bit trench BT is covered by the silicon oxide film, the low-resistance region BLb is not brought into contact with the silicon substrate 4. Consequently, a low-resistance material such as a metal and silicide does not pollute the silicon substrate 4.

Next, as shown in FIGS. 13A and 13B, the silicon oxide film 62 formed on one sidewall of the bit trench BT is selectively removed. This process can be performed by etching the bit trench BT in the state that the other sidewall of the bit trench BT is covered by photoresist (not shown). Accordingly, one sidewall 63 of the bit trench BT (the right sidewall of the bit trench BT in FIG. 13B) becomes in the exposed state. On the other hand, the other sidewall 64 of the bit trench BT (the left sidewall of the bit trench BT in FIG. 13B) is kept covered by the silicon nitride film 62.

In this state, as shown in FIGS. 14A and 14B, a conductive film becoming the material of the silicon material region BLa is deposited on the whole surface, and this conductive film is etched back. For the material of the silicon material region BLa, polysilicon doped with an impurity is selected, as described above. The etch-back amount needs to be adjusted so that the upper surface of the silicon material region BLa is positioned above the lower surface of the sidewall nitride film 61.

Accordingly, the silicon material region BLa of the bit line BL is embedded in the upper part of the bit trench BT. In this case, because one sidewall 63 of the bit trench BT is exposed, the silicon material region BLa of the bit line BL is in contact with the exposed silicon substrate 4. Because the other sidewall 64 of the bit trench BT is covered by the silicon oxide film 62, the silicon material region BLa is not in contact with the silicon substrate 4 at this part. The bit line BL including the silicon material region BLa and the low-resistance region BLb is completed in this way.

Next, as shown in FIGS. 15A and 15B, the impurity contained in the silicon material region BLa is diffused to the lower part of the silicon fin 60 by thermal oxidation. The diffusion of the impurity occurs where the silicon material region BLa is in contact with the silicon substrate 4, that is, on the one sidewall 63 of the bit trench BT. On the other hand, the whole of the other sidewall 64 of the bit trench BT is covered by the silicon oxide film 62, and there is no contact between the silicon material region BLa and the silicon substrate 4. Therefore, the impurity is not diffused at this side. Consequently, the first diffusion layer is formed at the lower part of the silicon fin 60, and the corresponding bit line BL and the first diffusion layer 11 are connected to each other. As a result, a thermal oxidation film 65 is formed at the upper part of the silicon material region BLa.

Next, as shown in FIGS. 16A and 16B, a silicon oxide film is formed on the whole surface, and then, a CMP is performed using a silicon nitride film 73(73b) as a stopper, thereby embedding a silicon oxide film 66 into between the silicon fins 60. The processing in the bit line direction is completed in the above. A processing in the word line direction is performed next.

In processing in the word line direction, as shown in FIGS. 17A to 17E, the hard masks 73 are disconnected in the bit line direction, using plural masks 80 extending to the word line direction. Accordingly, the hard masks 73 used to generate the silicon fins 60 are laid out in a matrix shape. In this state, as shown in FIGS. 18A to 18E, the silicon substrate 4 is etched using the hard masks 73 in a matrix shape. Consequently, the silicon fins are disconnected in the bit line direction, and the silicon pillars 10 are formed. Although not shown in the drawings, the dummy silicon pillars 30 are also formed.

Next, as shown in FIG. 19A to FIG. 19E, the silicon oxide films 65 and 66 are all removed by wet etching. In this case, when an unnecessary sidewall nitride film 61 remains, this film is removed as shown in FIGS. 20A to 20E.

Next, as shown in FIG. 21A to 21E, a silicon nitride film is formed on the whole surface, and this surface is etched back. A sidewall of the silicon pillar 10 is covered by a sidewall nitride film 67. The sidewall nitride film 67 needs to have its film thickness set to the extent that a part of the silicon substrate 4 and the bit line BL is exposed at the bottom of the silicon pillar 10. Particularly, because the interval between the silicon pillars 10 in the word line direction is small, the film thickness of the sidewall nitride film 67 needs to be smaller than a half of the interval between silicon pillars in the word line direction.

Next, as shown in FIGS. 22A to 22E, the exposed upper part of the silicon substrate 4 and the bit line BL are oxidized by thermal oxidation, thereby forming a silicon oxide film 68. Thereafter, as shown in FIGS. 23A to 23E, all the sidewall nitride films 61 and 67 are removed by wet etching. In this case, the etching amount needs to be set to avoid removing all the hard mask 73 covering the upper part of the silicon pillar 10. As a result, the whole side surface of the silicon pillar 10 is exposed, and the upper parts of the silicon pillars 10 are covered by the hard masks 73.

The following processes will be explained using a cross section corresponding to the cross section along the line B-B shown in FIG. 3.

Figure 24:
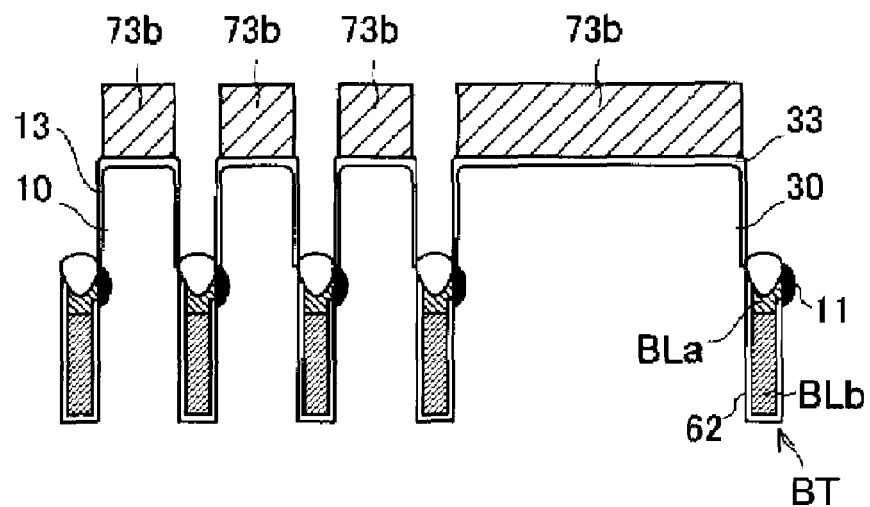
FIG. 24 shows a process (forming a gate insulation film 13 and a dummy gate insulation film 33) in the method of manufacturing the semiconductor memory device according to the present embodiment.
Figure 25:
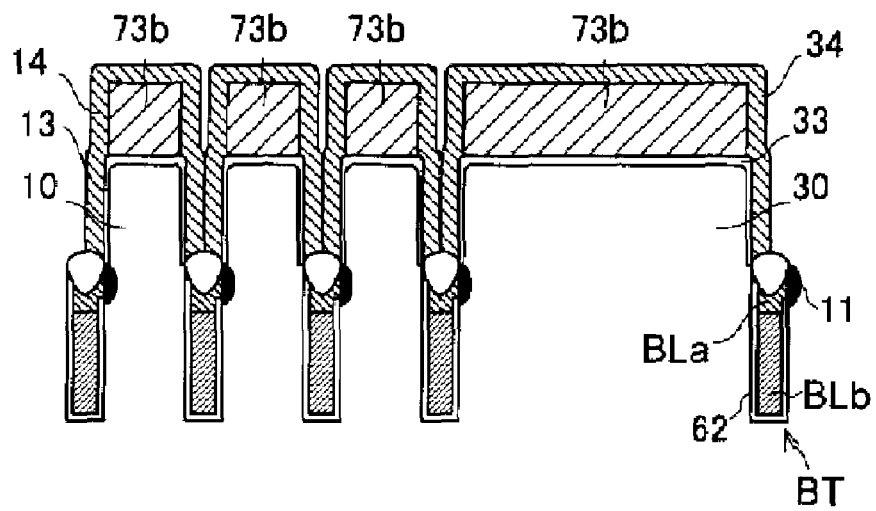
FIG. 25 shows a process (forming a polysilicon film) in the method of manufacturing the semiconductor memory device according to the present embodiment.

First, the gate insulation film 13 and the dummy-gate insulation film 33 are formed simultaneously on the side surface of the silicon pillar 10 and the dummy silicon pillar 30 (FIG. 24). The gate insulation film 13 and the dummy-gate insulation film 33 can be formed by thermal oxidation. Preferably, these film thicknesses are about 5 nm.

Figure 26:
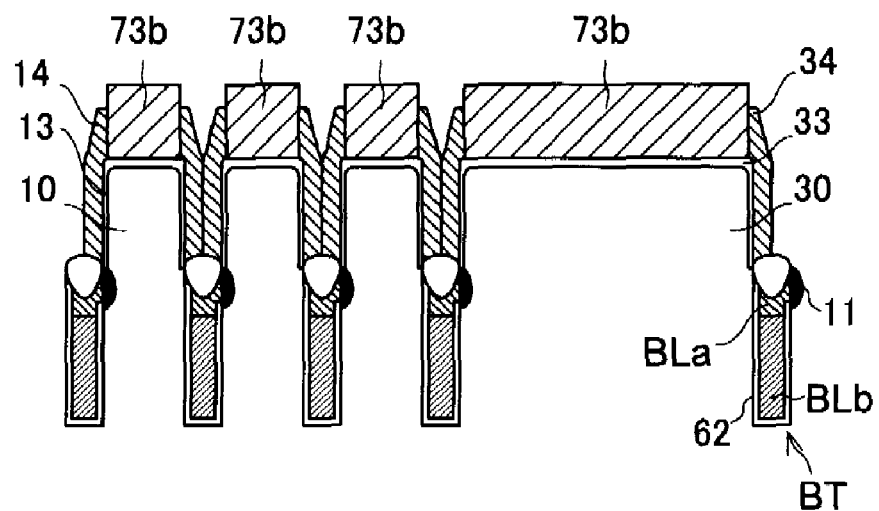
FIG. 26 shows a process (forming a gate electrode 14 and a dummy gate electrode 34 by etching back) in the method of manufacturing the semiconductor memory device according to the present embodiment.

Next, the gate electrode 14 and the dummy gate electrode 34 are formed using a polysilicon film. The gate electrode 14 and the dummy gate electrode 34 can be formed by first forming a polysilicon film having a film thickness of about 30 nm on the whole surface of the substrate by the CVD method (FIG. 25), and then etching back of the polysilicon film (FIG. 26). Accordingly, the side surface of the silicon pillar 10 formed with the gate insulation film 13 becomes in the state of being covered by the gate electrode 14, and the side surface of the dummy silicon pillar 30 formed with the dummy-gate insulation film 33 becomes in the state of being covered by the dummy gate electrode 34. Because the interval between the silicon pillars 10 adjacent in the word line direction is set smaller than two times the film thickness of the gate electrode 14, the gate electrodes 14 covering the silicon pillars 10 are in contact with each other. The gate electrode 14 and the dummy gate electrode 34 adjacent to each other are also in a contact state. On the other hand, because the interval between the silicon pillars 10 adjacent in the bit line direction is set more than two times the film thickness of the gate electrode 14, the gate electrodes 14 covering the silicon pillars 10 are isolated from each other.

Figure 27:
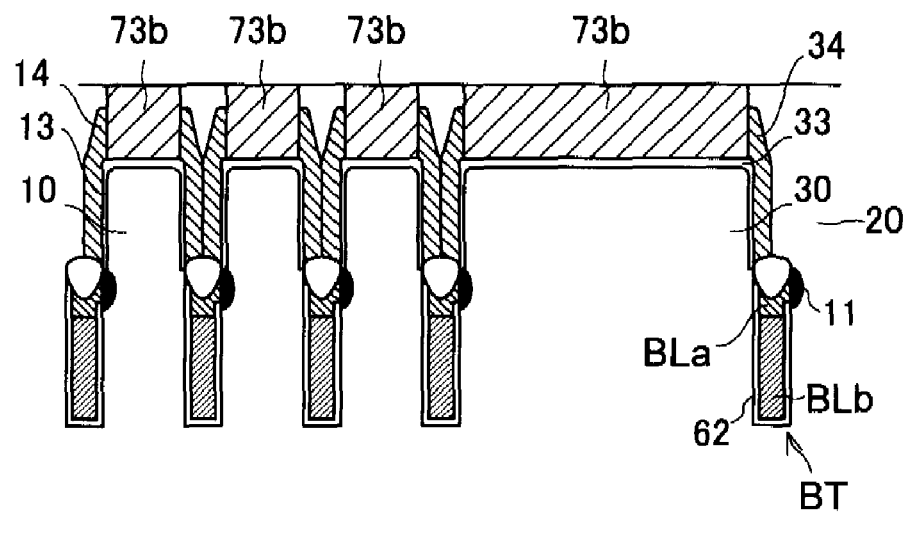
FIG. 27 shows a process (forming a interlayer insulation film 20) in the method of manufacturing the semiconductor memory device according to the present embodiment.

Next, the interlayer insulation film 20 including a silicon oxide film is formed on the whole surface of the substrate, and then, the surface of the interlayer insulation film 20 is ground to be flattened by the CMP method (FIG. 27). In this case, the silicon nitride film 73b constituting the hard mask 73 works as a CMP stopper. Therefore, the film thickness of the interlayer insulation film 20 can be securely controlled. As a result, a gap between the silicon nitride films 73b is embedded with the interlayer insulation film 20.

Figure 28:
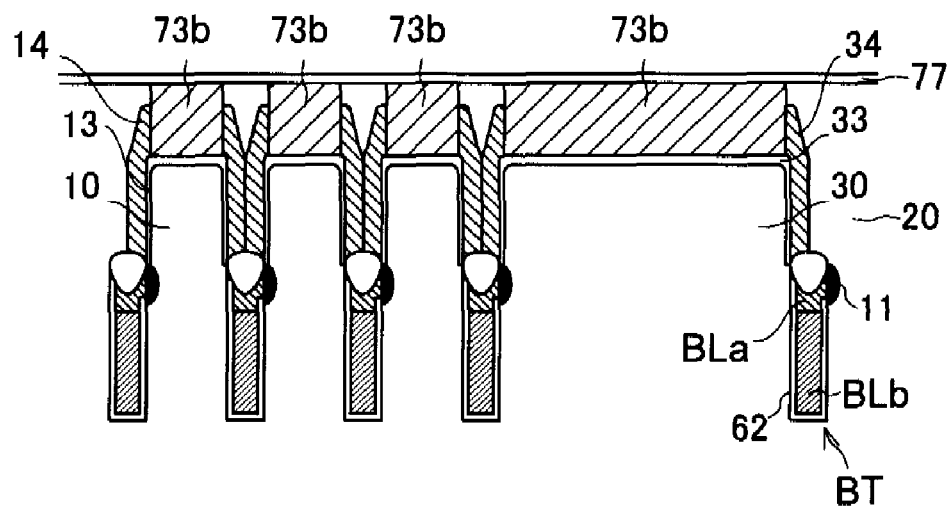
FIG. 28 shows a process (forming a mask oxidation film 77) in the method of manufacturing the semiconductor memory device according to the present embodiment.
Figure 29:
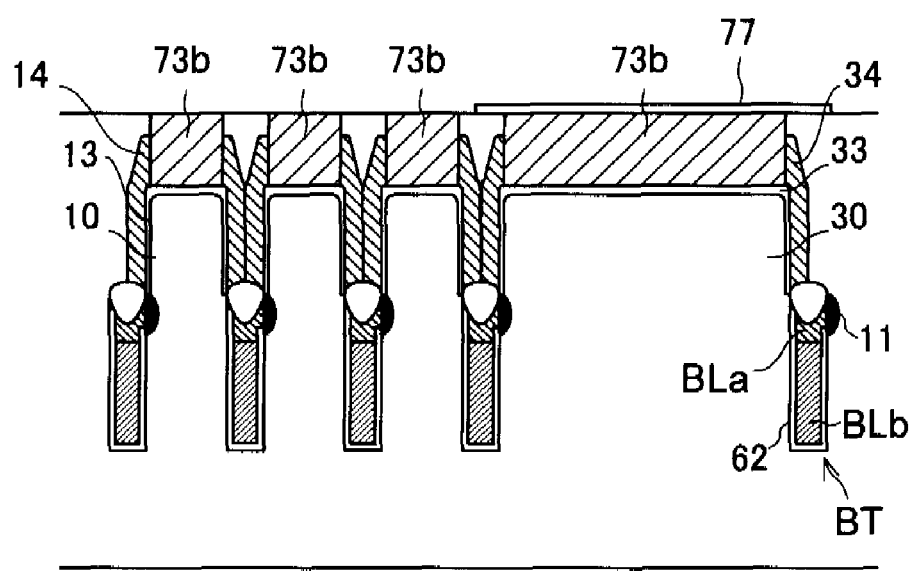
FIG. 29 shows a process (patterning the mask oxidation film 77) in the method of manufacturing the semiconductor memory device according to the present embodiment.
Figure 30:
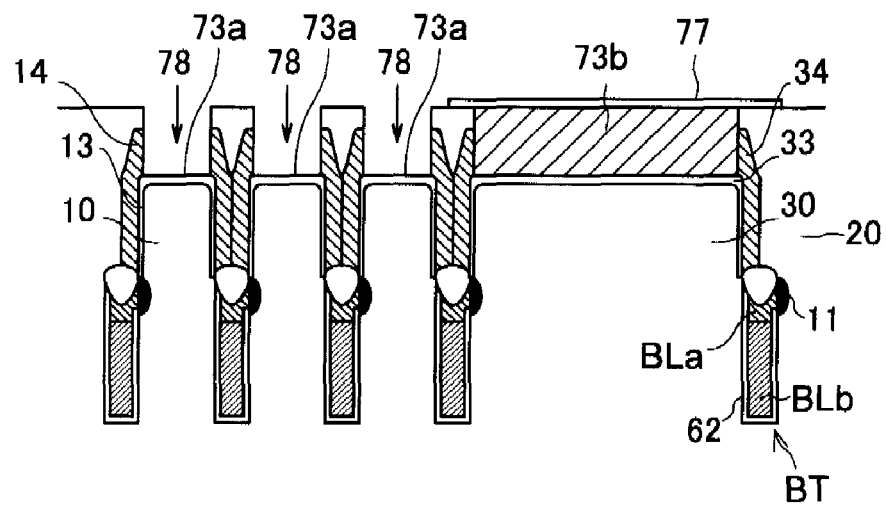
FIG. 30 shows a process (forming a through hole 78) in the method of manufacturing the semiconductor memory device according to the present embodiment.

Next, the hard mask 73 provided above the silicon pillar 10 are selectively removed, thereby forming a through-hole (opening) 78. In forming the through-hole 78, a mask oxide film 77 including a silicon oxide film is formed on the whole surface of the substrate (FIG. 28). The mask oxide film 77 can be formed by the CVD method. Preferably, a film thickness of the mask oxide film 77 is about 5 nm. Next, the mask oxide film 77 is patterned so that the silicon nitride film 73b above the silicon pillar 10 is exposed (FIG. 29). In this case, the silicon nitride film 73b formed above the dummy silicon pillar 30 is left in the state of being covered by the mask oxide film 77. Thereafter, the exposed silicon nitride film 73b is removed by dry etching or wet etching, thereby forming the through-hole 78 having the silicon oxide film 73a as a bottom surface (FIG. 30).

The through-hole 78 is formed by removing the silicon nitride film 73b used as a mask to form the silicon pillar 10. Therefore, the through-hole 78 is formed in self-alignment with the silicon pillar 10. As a result, the wall surface of the through-hole 78 and the external periphery of the silicon pillar 10 coincide in plane view.

Figure 31:
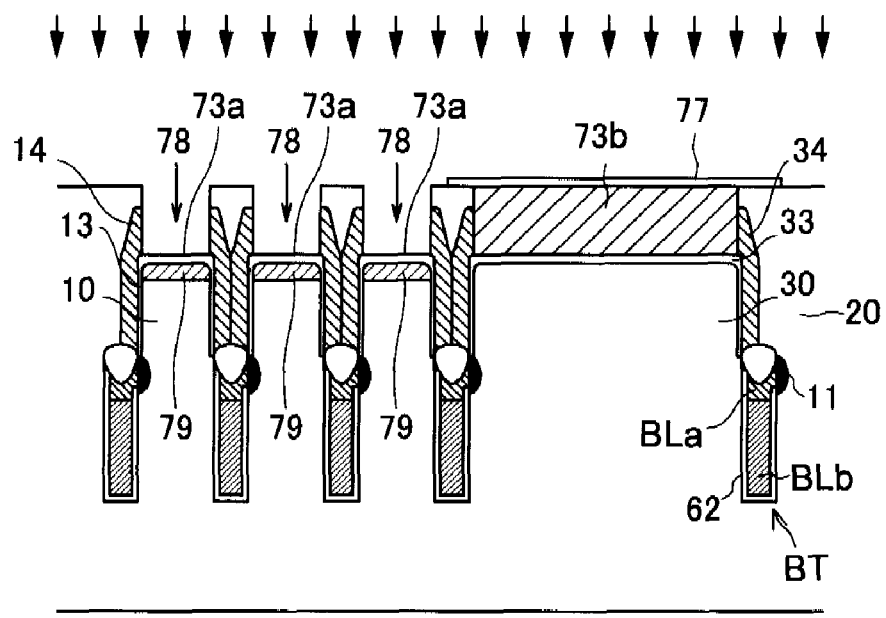
FIG. 31 shows a process (forming LDD regions 79) in the method of manufacturing the semiconductor memory device according to the present embodiment.

Next, an LDD (Lightly Doped Drain) region 79 is formed at the upper part of the silicon pillar 10 (FIG. 31). The LDD region 79 can be formed by shallowly implanting an impurity of low concentration having conductivity opposite to that of the impurity in the silicon substrate, via the silicon oxide film 73a formed at the upper part of the silicon pillar 10.

Figure 32:
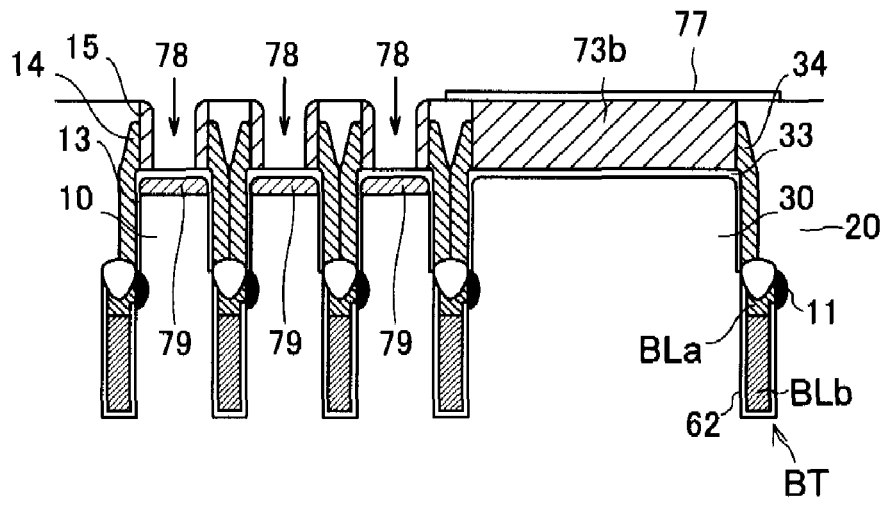
FIG. 32 shows a process (forming a sidewall insulation film 15) in the method of manufacturing the semiconductor memory device according to the present embodiment.
Figure 33:
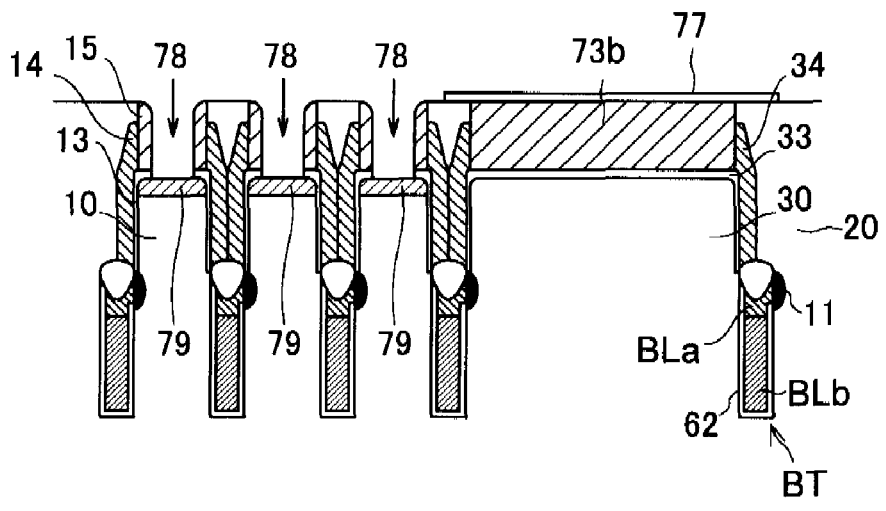
FIG. 33 shows a process (removing a silicon oxidation film 73a) in the method of manufacturing the semiconductor memory device according to the present embodiment.

Next, the sidewall insulation film 15 is formed on the inner wall of the through-hole 78 (FIG. 32). The sidewall insulation film 15 can be formed by forming a silicon nitride film on the whole surface of the substrate, and etching back this film. While not particularly limited, preferably, the film thickness of the silicon nitride film is about 10 nm. As explained above, the sidewall insulation film 15 is formed on the inner wall surface of the through-hole 78, and the through-hole 78 is formed by removing the silicon nitride film as a hard mask used to form the silicon pillar 10. Therefore, the external periphery of the cylindrical sidewall insulation film 15 and the external periphery of the silicon pillar 10 coincide in plane view.

Figure 34:
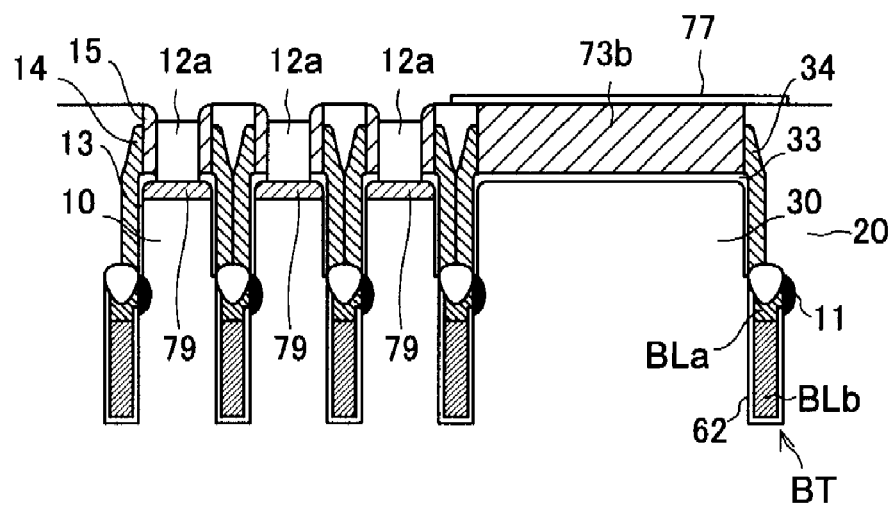
FIG. 34 shows a process (forming a silicon epitaxial layer 12a) in the method of manufacturing the semiconductor memory device according to the present embodiment.
Figure 35:
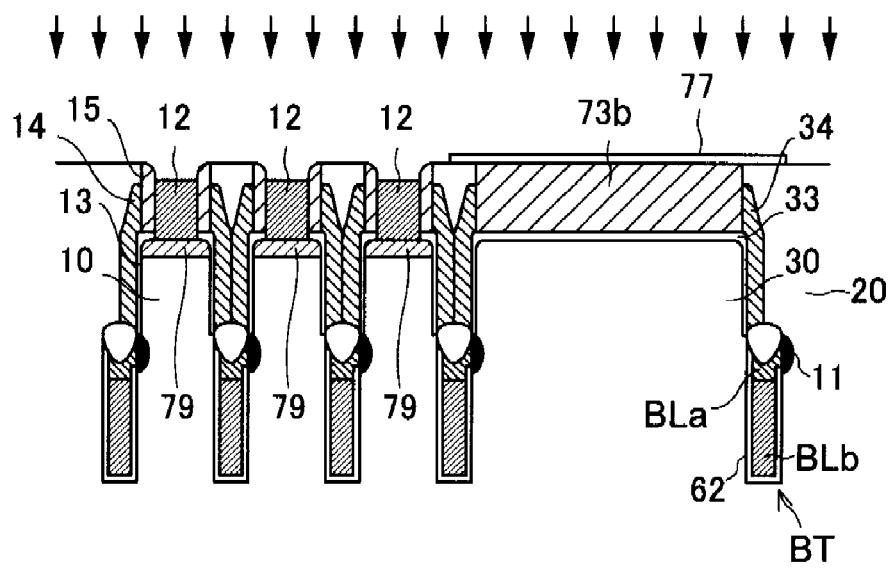
FIG. 35 shows a process (forming a second diffusion layer 12) in the method of manufacturing the semiconductor memory device according to the present embodiment.
Figure 36:
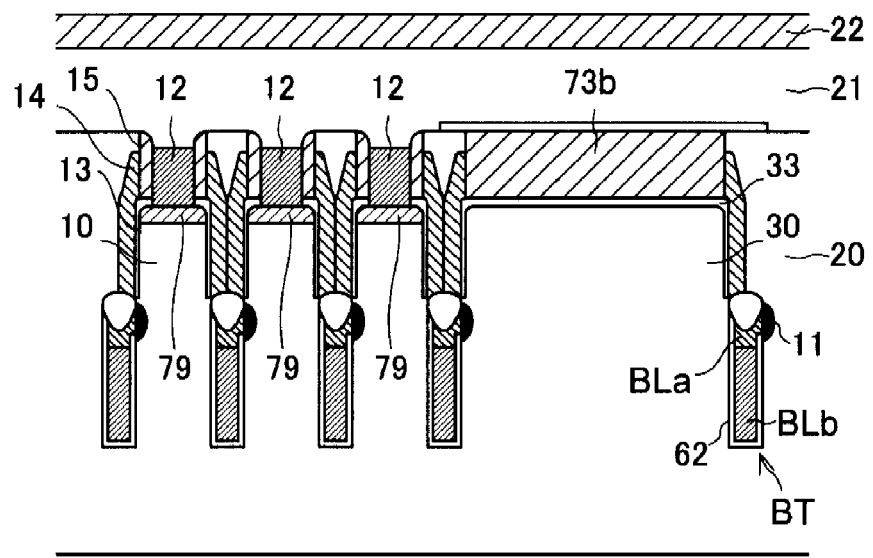
FIG. 36 shows a process (forming a inter layer insulation film 21 and a silicon nitride film 22) in the method of manufacturing the semiconductor memory device according to the present embodiment.

Next, the second diffusion layer 12 is formed on the upper part of the silicon pillar 10. In forming the second diffusion layer 12, the through-hole 78 is dug down by removing the silicon oxide film 73a at the bottom of the through-hole 78 (FIG. 33), and thereafter, the silicon epitaxial layer 12a is formed inside the through-hole 78 by the selective epitaxial growth method (FIG. 34). Next, an impurity of high concentration having conductivity opposite to that of the impurity in the silicon substrate is ion implanted, thereby forming the second diffusion layer 12 (FIG. 35). As a result, the second diffusion layer 12 is formed in self-alignment with respect to the silicon pillar 10.

Figure 37:
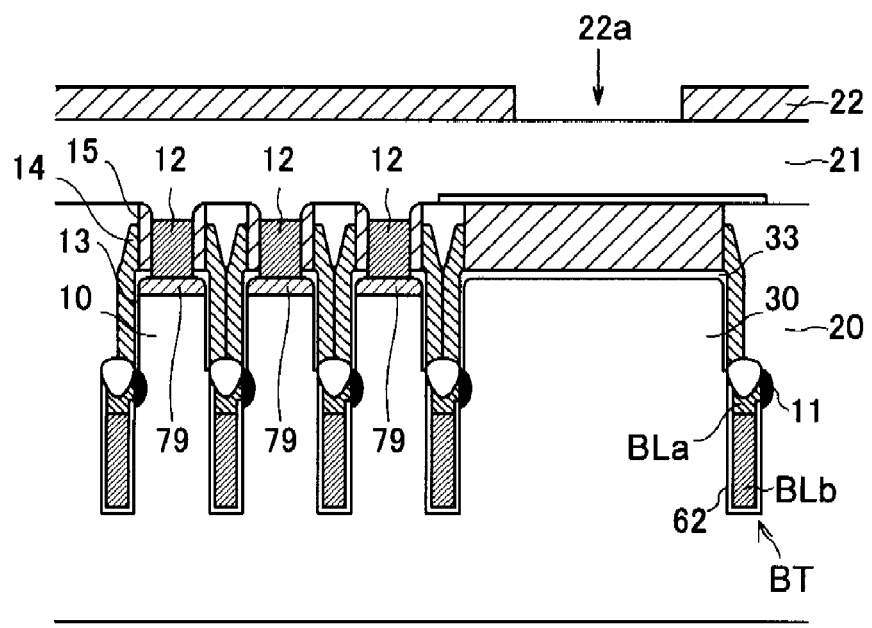
FIG. 37 shows a process (forming an opening 22a) in the method of manufacturing the semiconductor memory device according to the present embodiment.

Next, the interlayer insulation film 21 and the silicon nitride film 22 are sequentially formed on the whole surface of the substrate (FIG. 36), and then, the silicon nitride film 22 is patterned, thereby forming an opening 22a above the dummy silicon pillar 30 (FIG. 37).

Figure 38:
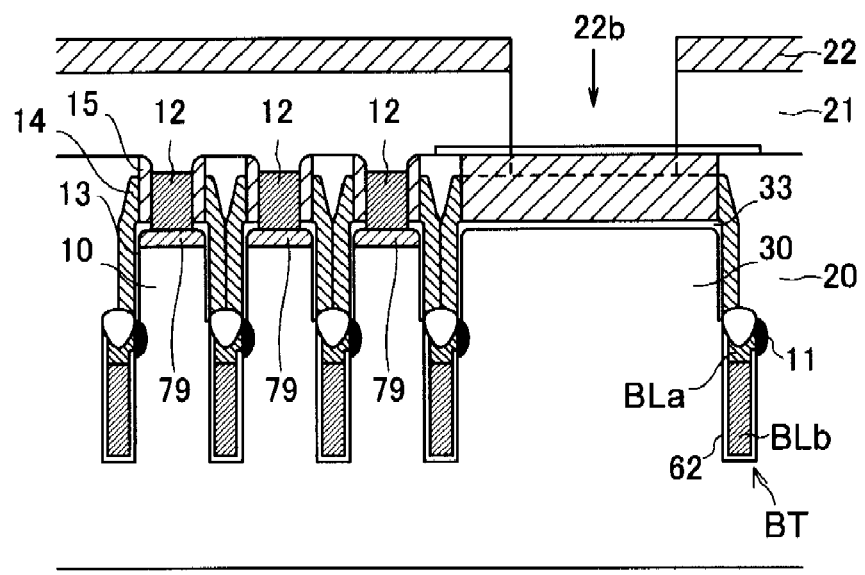
FIG. 38 shows a process (forming a contact hall 22b) in the method of manufacturing the semiconductor memory device according to the present embodiment.
Figure 39:
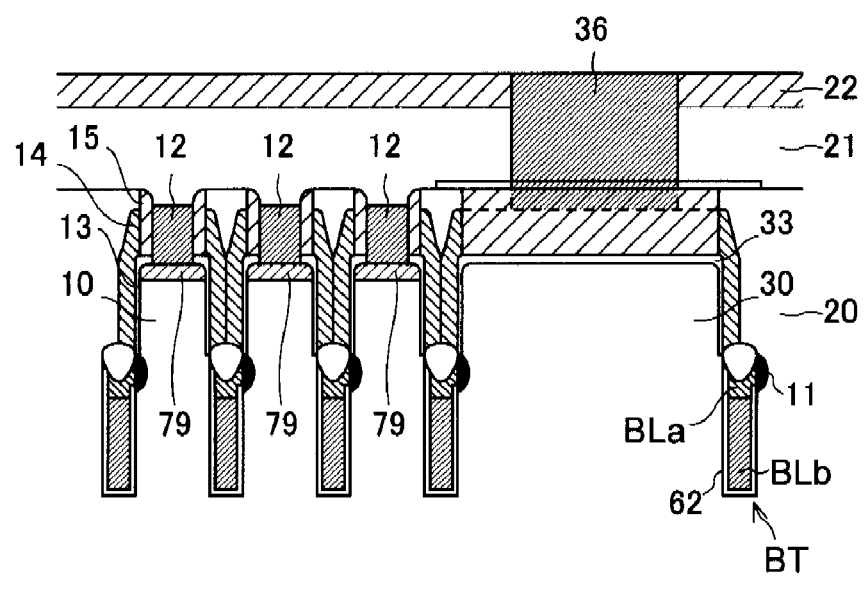
FIG. 39 shows a process (forming a word contact 36) in the method of manufacturing the semiconductor memory device according to the present embodiment.
Figure 40:
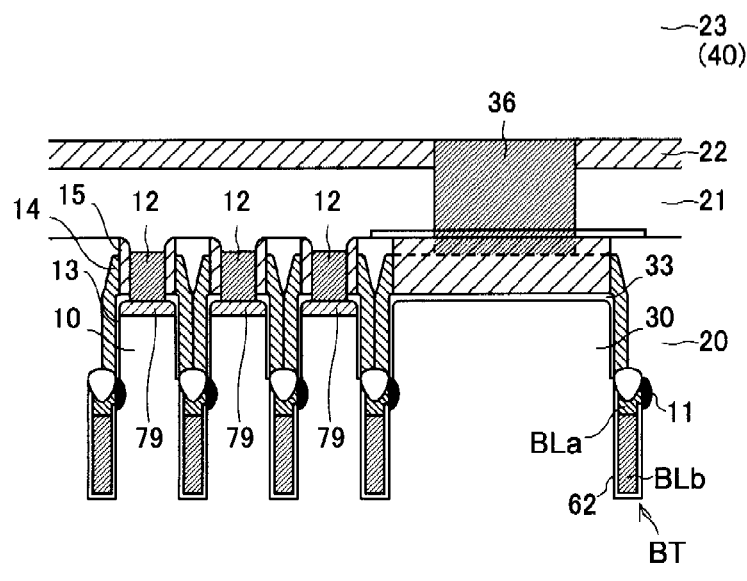
FIG. 40 shows a process (forming a interlayer insulation film 23) in the method of manufacturing the semiconductor memory device according to the present embodiment.

The interlayer insulation film 21 is then dry etched, using the silicon nitride film 22 as a mask, thereby forming a contact through-hole 22b penetrating through the interlayer insulation film 21 (FIG. 38). The contact hole is embedded with a polysilicon film, thereby forming the word contact 36 (FIG. 39). The interlayer insulation film 23 is formed (FIG. 40), and a slit (not shown) to form the auxiliary word line 40 is formed in the word line direction on the interlayer insulation film 23. The inside of the slit is embedded with a low-resistance material, thereby forming the auxiliary word line 40 (not shown) connected to the dummy gate electrode 34.

Figure 41:
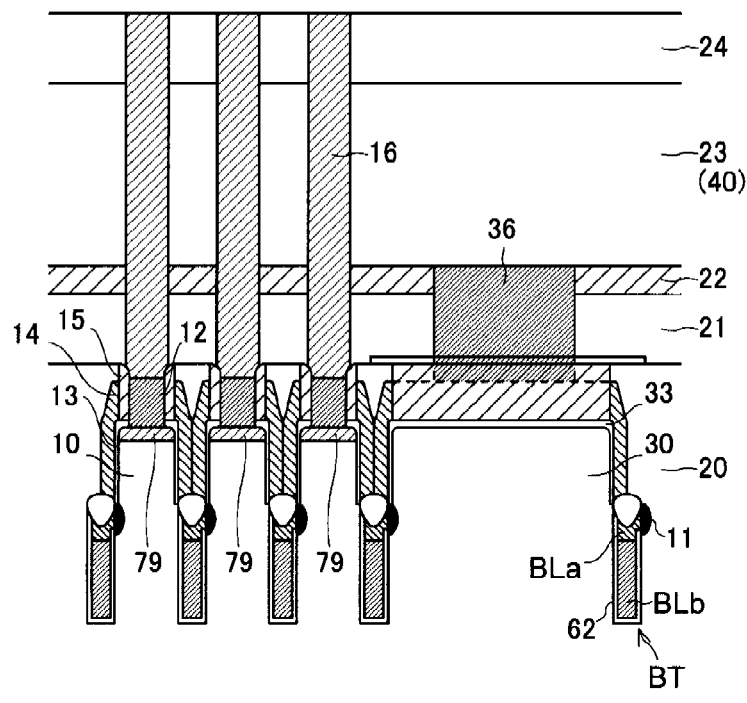
FIG. 41 shows a process (forming a storage node contact 16) in the method of manufacturing the semiconductor memory device according to the present embodiment.

Next, the interlayer insulation film 24 is formed, and the storage node contact 16 penetrating through the interlayer insulation films 21 to 24 is formed (FIG. 41). The storage node contact 16 can be formed by first forming a contact hole above each silicon pillar 10, and then embedding the inside of the contact hole with a polysilicon film. Accordingly, the storage node contact 16 is connected to the second diffusion layer 12.

Thereafter, the capacitor Cp and the reference potential wiring PL are formed using a normal process. The semiconductor memory device according to the present embodiment is completed in the above.

As explained above, according to the method of manufacturing a semiconductor memory device of the present invention, the whole surface of the bit trench BT is covered by the silicon oxide film 62, and the low-resistance region BLb is formed inside the bit trench BT. Therefore, the low-resistance region BLb can be prevented from being in contact with the silicon substrate 4. Consequently, the low-resistance material such as a metal and silicide does not pollute the silicon substrate 4.

Because the gate electrode covering the plural silicon pillars adjacent in the bit line direction is isolated by etching back the gate electrode, the gate electrode does not require patterning, and the manufacturing process can be simplified. Because the dummy gate electrode 34 is formed to cover the dummy silicon pillar 30, the gate electrode 14 and the auxiliary word line 40 can be easily connected to each other via the dummy gate electrode 34. Because the silicon pillar 10 and the dummy silicon pillar 30 can be formed simultaneously using a common mask, the interval between the two can be controlled in high precision. Further, the gate electrode 14 formed on the silicon pillar 10 and the dummy gate electrode 34 formed on the dummy silicon pillar 30 can be securely connected.

The gate electrode 14 and the dummy gate electrode 34 are formed, by leaving the hardmask 73 used to form the silicon pillar 10 and the dummy silicon pillar 30. Thereafter, the hard mask 73 on the silicon pillar 10 is removed. Therefore, the through-hole 78 can be formed in self-alignment to the upper part of the silicon pillar 10. Consequently, by forming the second diffusion layer 12 within the through-hole 78, the second diffusion layer 12 can be formed in self-alignment to the silicon pillar 10.

A device configuration of the semiconductor memory device according to the present embodiment is explained next, based on an example that the memory element M is a phase-change element.

Figure 42:
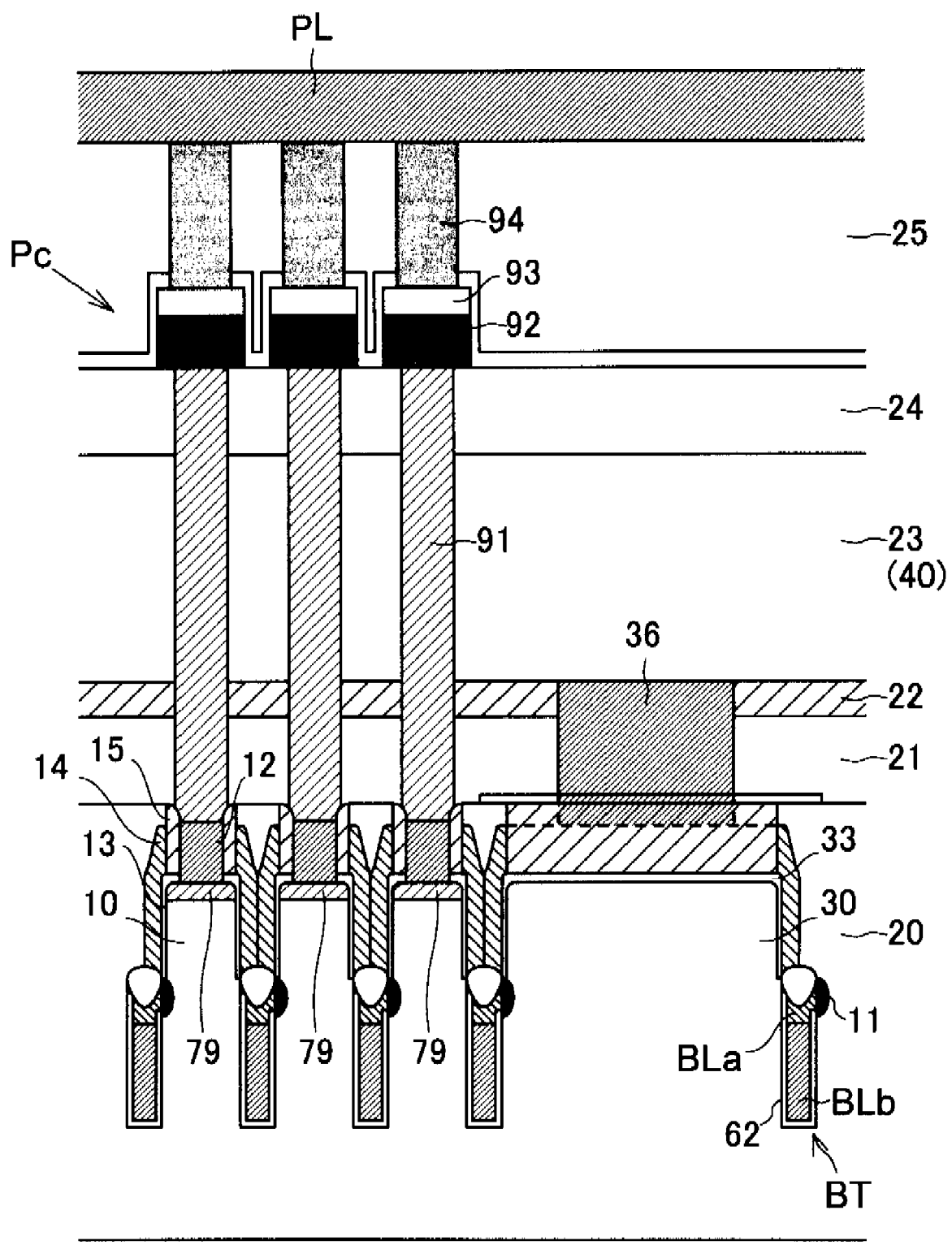
FIG. 42 is a schematic cross-sectional view showing a device configuration of a semiconductor memory device according to another preferred embodiment of the present invention.

FIG. 42 is a schematic cross-sectional view showing a device configuration of a semiconductor memory device according to another preferred embodiment of the present invention.

As shown in FIG. 42, according to the present embodiment, a phase-change element Pc is used for the memory element M of the memory cell MC shown in FIG. 2. The phase-change element Pc includes a lower electrode (heater plug) 91 connected to the second diffusion layer 12, an upper electrode 93 connected to the reference potential wiring PL via a reference potential contact 94, and a recording layer 92 provided between the lower electrode 91 and the upper electrode 93.

A phase change material is used for the recording layer 92. For the phase change material, there is no particular limit when the material has two or more phase states and also when the electric resistance is different depending on a phase state. Preferably, a calcogenide material is selectively used. The calcogenide material is an alloy containing at least one of elements of germanium (Ge), antimony (Sb), tellurium (Te), indium (In), and selenium (Se). For example, there are binary elements such as GaSb, InSb, InSe, $Sb_2Te_3$, and GeTe, ternary elements such as $Ge_2Sb_2Te_5$, InSbTe, GaSeTe, $SnSb_2Te_4$, and InSbGe, and quaternary elements such as AgInSbTe, (GeSn)SbTe, GeSb(SeTe), $Te_{81}Ge_{15}Sb_2S_2$. In the present embodiment, preferably, $Ge_2Sb_2Te_5$ (GST) is selectively used. While the film thickness of the recording layer 92 is not particularly limited, the film thickness can be set to 10 nm to 200 nm, for example, in the present embodiment. The sputtering method can be used to form the film of the recording layer 92.

The lower electrode 91 is used as a heater plug, and becomes a part of a heater at the data writing time. Therefore, for the material of the lower electrode 91, preferably, a material having relatively high electric resistance is used such as metal silicide, metal nitride, and nitride of metal silicide. While not particularly limited, there can be preferably used a high-melting-point metal and its nitride such as W, TiN, TaN, WN, and TiAlN, a high-melting-point metal silicide such as TiSiN and WSiN, and TiCN.

The upper electrode 93 works to protect the recording layer 92 at the time of patterning the recording layer 92. For the material of the bit contact 94, preferably, a material having relatively low conductivity is used to avoid escape of heat generated by current conduction. To be specific, a material such as TiAlN, TiSiN, and TiCN is preferably used, like the material for the lower electrode 91.

The semiconductor memory device having the above configuration can write and read data, by activating any one of the word lines by the word driver WD, and passing a current to at least one of the bit lines in this state. That is, the cell transistor Tr is ON in the memory cell MC in which the corresponding word line is activated. Therefore, the corresponding bit line is connected to the bit line BL via the phase-change element Pc. Accordingly, when a write current is passed to a predetermined bit line FL in this state, a phase of the recording layer 92 included in the phase-change element Pc can be changed to a crystal phase or an amorphous phase. When a read current is passed to the bit line BL, a current value changes depending on whether the recording layer 92 included in the phase-change element Pc is in the crystal phase or the amorphous phase. Therefore, data can be read based on the above.

Figure 43:
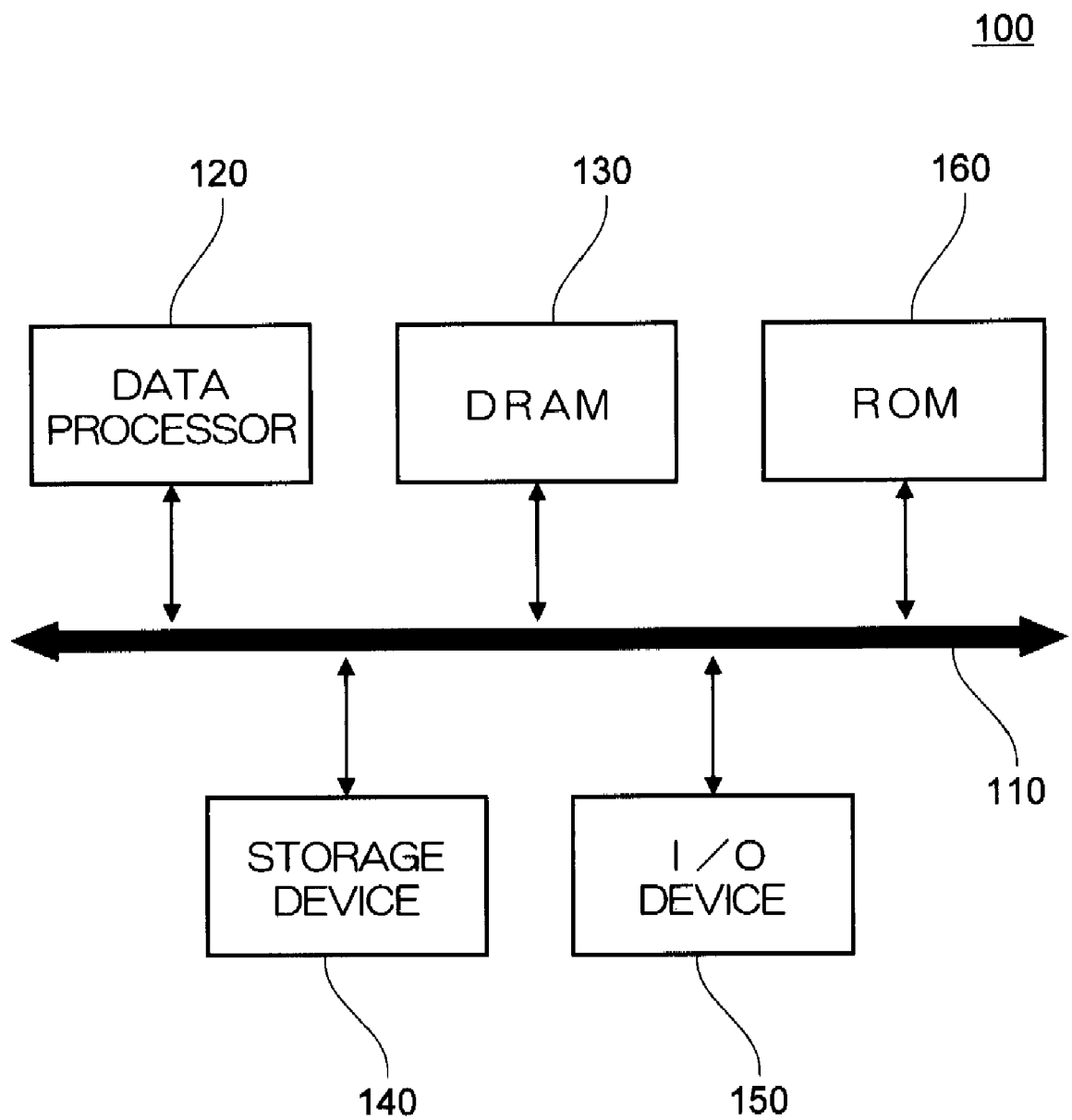
FIG. 43 is a block diagram showing a structure of a data processing system 100 using the semiconductor memory device according to the preferred embodiment of the present invention.

FIG. 43 is a block diagram showing a data processing system 100 using the DRAM that the present invention is applied.

The data processing system 100 shown in FIG. 43 includes a data processor 120 and a DRAM 130 that the present invention is applied are connected to each other via a system bus 110. The data processor 120 can be selected from at least a microprocessor (MPU) and a digital signal processor (DSP). In FIG. 43, although the data processor 120 and the DRAM 130 are connected via the system bus 110 in order to simplify the diagram, they can be connected via not the system bus 110 but a local bus.

Further, in FIG. 43, although only one set of system bus 110 is employed in the data processing system 100 in order to simplify the diagram, a serial bus or a parallel bus connected to the system bus 110 via connectors can be provided. As shown in FIG. 43, a storage device 140, an I/O device 150, and a ROM 160 are connected to the system bus 110. However, they are not essential element for the data processing system 100.

The storage device 140 can be selected from at least a hard disk drive, an optical disk drive, and flash memory device. The I/O device 150 can be selected from a display device such as a liquid crystal display (LCD) and an input device such as a key board or a mouse. The I/O device 150 can consists of either input or output device. Further, although each one element is provided as shown in FIG. 43, two or more same elements can be provided in the data processing system.

While a preferred embodiment of the present invention has been described hereinbefore, the present invention is not limited to the aforementioned embodiment and various modifications can be made without departing from the spirit of the present invention. It goes without saying that such modifications are included in the scope of the present invention.

For example, in the above embodiments, the second diffusion layer 12 to be formed on the upper part of the silicon pillar 10 is formed by the selective epitaxial growth method. However, the method of forming the second diffusion layer 12 is not limited to the method, and a polysilicon film doped with an impurity can be embedded by the CVD method. When the selective epitaxial growth method is used, continuity of crystal can be secured, and more satisfactory transistor characteristic can be obtained. While the silicon pillar 10 and the second diffusion layer 12 include mutually different parts in the above embodiments, the second diffusion layer 12 can be formed within the silicon pillar 10.

What is claimed is:

1. A semiconductor memory device comprising:
   a silicon pillar formed substantially perpendicular to a main surface of a substrate;
   a gate electrode covering a side surface of the silicon pillar via a gate insulation film;
   first and second diffusion layers provided in a lower part and an upper part, respectively of the silicon pillar;
   a bit line embedded into the substrate and connected to the first diffusion layer; and
   a memory element disposed above the silicon pillar and connected to the second diffusion layer,
   wherein the bit line includes a silicon material region in contact with the first diffusion layer and a low-resistance region including a material having lower electric resistance than that of the silicon material region.

2. The semiconductor memory device as claimed in claim 1, wherein the low-resistance region includes a metal or a compound thereof.

3. The semiconductor memory device as claimed in claim 1, wherein the silicon pillar is one of a plurality of silicon pillars, the gate electrode is one of a plurality of gate electrodes, the gate electrodes covering the silicon pillars adjacently provided in a first direction crossing the bit line are in contact with each other, and the gate electrodes covering the silicon pillars adjacently provided in a second direction parallel with the bit line are isolated from each other.

4. The semiconductor memory device as claimed in claim 3, further comprising:
   a dummy silicon pillar intervening in a row of the plurality of silicon pillars extending to the first direction;
   a dummy gate electrode covering a surface of the dummy silicon pillar via a dummy insulation film; and
   an auxiliary word line extending in the first direction, and connected to the dummy gate electrode,
   wherein the gate electrode covering the silicon pillar adjacent to the dummy silicon pillar is in contact with the dummy gate electrode.

5. The semiconductor memory device as claimed in claim 4, wherein a plurality of the dummy silicon pillars are provided in the second direction.

6. The semiconductor memory device as claimed in claim 1, further comprising an interlayer-insulation film provided over the silicon pillar, wherein the second diffusion layer is connected to an upper part of the silicon pillar via a through-hole provided in the interlayer-insulation film.

7. The semiconductor memory device as claimed in claim 1, wherein the memory element is a capacitor.

8. A semiconductor memory device comprising:
   a silicon pillar formed substantially perpendicular to a main surface of a substrate;
   a gate electrode covering a side surface of the silicon pillar via a gate insulation film;
   first and second diffusion layers provided in a lower part and an upper part, respectively of the silicon pillar;
   a bit line embedded into the substrate and connected to the first diffusion layer; and
   a memory element disposed above the silicon pillar and connected to the second diffusion layer,
   wherein the bit line includes a silicon material region in contact with the first diffusion layer and a low-resistance region including a material having lower electric resistance than that of the silicon material region, and
   wherein the low-resistance region is positioned below the silicon material region.

9. The semiconductor memory device as claimed in claim 8, wherein a surface of the low-resistance region is covered by an insulation film excluding a surface in contact with the silicon material region.

10. A semiconductor memory device comprising:
    a silicon pillar formed substantially perpendicular to a main surface of a substrate;
    a gate electrode covering a side surface of the silicon pillar via a gate insulation film;
    first and second diffusion layers provided in a lower part and an upper part, respectively of the silicon pillar;
    a bit line embedded into the substrate and connected to the first diffusion layer; and
    a memory element disposed above the silicon pillar and connected to the second diffusion layer;
    a dummy silicon pillar intervening in a row of the plurality of silicon pillars extending to the first direction;
    a dummy gate electrode covering a surface of the dummy silicon pillar via a dummy insulation film; and
    an auxiliary word line extending in the first direction, and connected to the dummy gate electrode,
    wherein the bit line includes a silicon material region in contact with the first diffusion layer and a low-resistance region including a material having lower electric resistance than that of the silicon material region,
    wherein the silicon pillar is one of a plurality of silicon pillars, the gate electrode is one of a plurality of gate electrodes, the gate electrodes covering the silicon pillars adjacently provided in a first direction crossing the bit line are in contact with each other, and the gate electrodes covering the silicon pillars adjacently provided in a second direction parallel with the bit line are isolated from each other,
    wherein the gate electrode covering the silicon pillar adjacent to the dummy silicon pillar is in contact with the dummy gate electrode, and
    wherein the auxiliary word line is made of a material having lower electric resistance than that of the gate electrode.

11. A semiconductor memory device comprising:
    a silicon pillar formed substantially perpendicular to a main surface of a substrate;
    a gate electrode covering a side surface of the silicon pillar via a gate insulation film;
    first and second diffusion layers provided in a lower part and an upper part, respectively of the silicon pillar;
    a bit line embedded into the substrate and connected to the first diffusion layer; and a memory element disposed above the silicon pillar and connected to the second diffusion layer;

an interlayer-insulation film provided over the silicon pillar, wherein the second diffusion layer is connected to an upper part of the silicon pillar via a through-hole provided in the interlayer-insulation film; and a cylindrical sidewall-insulation film provided on an inner wall of the through-hole, to insulate the second diffusion layer and the gate electrode, wherein the bit line includes a silicon material region in contact with the first diffusion layer and a low-resistance region including a material having lower electric resistance than that of the silicon material region.

12. The semiconductor memory device as claimed in claim 11, wherein an external periphery of the cylindrical sidewall-insulation film and an external periphery of the silicon pillar substantially coincide in plane view.

13. A semiconductor memory device comprising:

a silicon pillar formed substantially perpendicular to a main surface of a substrate;

a gate electrode covering a side surface of the silicon pillar via a gate insulation film;

first and second diffusion layers provided in a lower part and an upper part, respectively of the silicon pillar;

a bit line embedded into the substrate and connected to the first diffusion layer, and a memory element disposed above the silicon pillar and connected to the second diffusion layer, wherein the bit line includes a silicon material region in contact with the first diffusion layer and a low-resistance region including a material having lower electric resistance than that of the silicon material region, wherein the memory element is a capacitor, and wherein the memory element is a phase-change element.

14. A data processing system comprising a processor and a semiconductor memory device coupled to the processor, wherein the semiconductor memory device includes:

a silicon pillar formed substantially perpendicular to a main surface of a substrate;

a gate electrode covering a side surface of the silicon pillar via a gate insulation film;

first and second diffusion layers provided in a lower part and an upper part, respectively of the silicon pillar;

a bit line embedded into the substrate and connected to the first diffusion layer; and a memory element disposed above the silicon pillar and connected to the second diffusion layer, wherein the bit line includes a silicon material region in contact with the first diffusion layer and a low-resistance region including a material having lower electric resistance than that of the silicon material region.

* * * * *